(12) United States Patent
Lin et al.

(10) Patent No.: US 10,797,175 B2
(45) Date of Patent: Oct. 6, 2020

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Wei-Ken Lin, Tainan (TW); Chun Te Li, Renwu Township (TW); Chih-Peng Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/431,352

(22) Filed: Jun. 4, 2019

(65) Prior Publication Data

US 2019/0305125 A1    Oct. 3, 2019

Related U.S. Application Data

(62) Division of application No. 15/967,295, filed on Apr. 30, 2018, now Pat. No. 10,340,384.

(Continued)

(51) Int. Cl.
| | |
|---|---|
| *H01L 29/78* | (2006.01) |
| *H01L 29/66* | (2006.01) |
| *H01L 21/02* | (2006.01) |
| *H01L 21/321* | (2006.01) |
| *H01L 21/8234* | (2006.01) |
| *H01L 27/092* | (2006.01) |
| *H01L 21/8238* | (2006.01) |

(52) U.S. Cl.
CPC ........ *H01L 29/785* (2013.01); *H01L 21/0262* (2013.01); *H01L 21/3212* (2013.01); *H01L 21/823431* (2013.01); *H01L 21/823821* (2013.01); *H01L 27/0924* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |

(Continued)

FOREIGN PATENT DOCUMENTS

| | | | |
|---|---|---|---|
| KR | 20080032926 A | 4/2016 | |
| KR | 20170121667 A | 11/2017 | |

*Primary Examiner* — Dung A. Le
(74) *Attorney, Agent, or Firm* — Slater Matsil, LLP

(57) ABSTRACT

A method includes forming a first fin protruding above a substrate, the first fin having a PMOS region; forming a first gate structure over the first fin in the PMOS region; forming a first spacer layer over the first fin and the first gate structure; and forming a second spacer layer over the first spacer layer. The method further includes performing a first etching process to remove the second spacer layer from a top surface and sidewalls of the first fin in the PMOS region; performing a second etching process to remove the first spacer layer from the top surface and the sidewalls of the first fin in the PMOS region; and epitaxially growing a first source/drain material over the first fin in the PMOS region, the first source/drain material extending along the top surface and the sidewalls of the first fin in the PMOS region.

20 Claims, 28 Drawing Sheets

Related U.S. Application Data

(60) Provisional application No. 62/592,871, filed on Nov. 30, 2017.

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 9,607,838 | B1 * | 3/2017 | Lin .................... H01L 29/7842 |
| 9,818,846 | B2 * | 11/2017 | Ho .................... H01L 29/66795 |
| 10,050,147 | B2 * | 8/2018 | Liang .................... H01L 21/283 |
| 2008/0087967 | A1 | 4/2008 | Kim |
| 2013/0113042 | A1 | 5/2013 | Wang et al. |
| 2013/0168771 | A1 | 7/2013 | Wu et al. |
| 2013/0341733 | A1 * | 12/2013 | Erickson ......... H01L 21/823431 257/401 |
| 2014/0282326 | A1 | 9/2014 | Chen et al. |
| 2017/0309624 | A1 | 10/2017 | Cheng et al. |
| 2018/0233413 | A1 | 8/2018 | Jacob |

\* cited by examiner

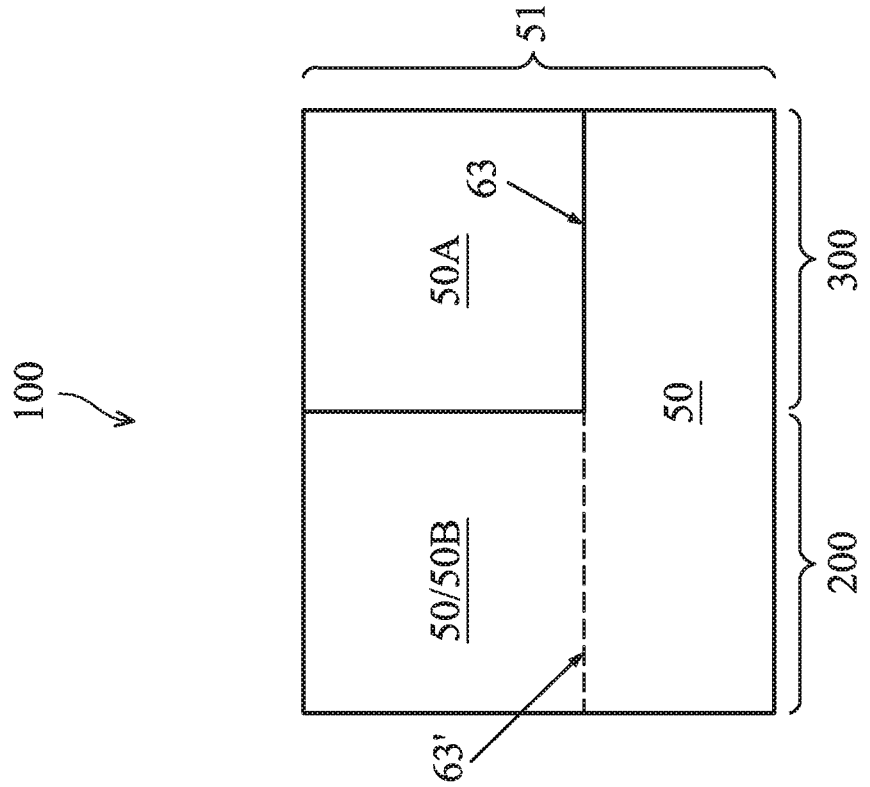
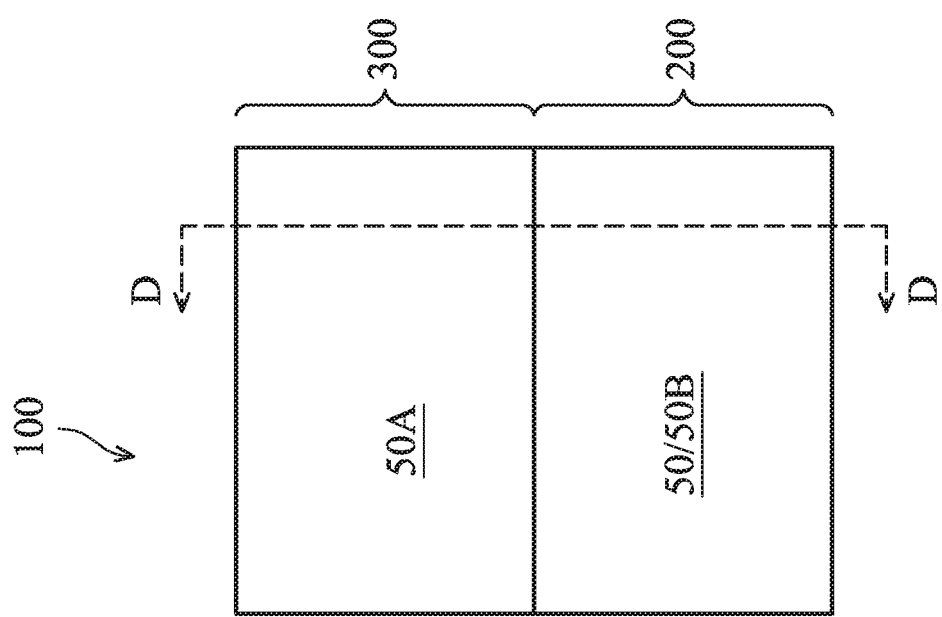

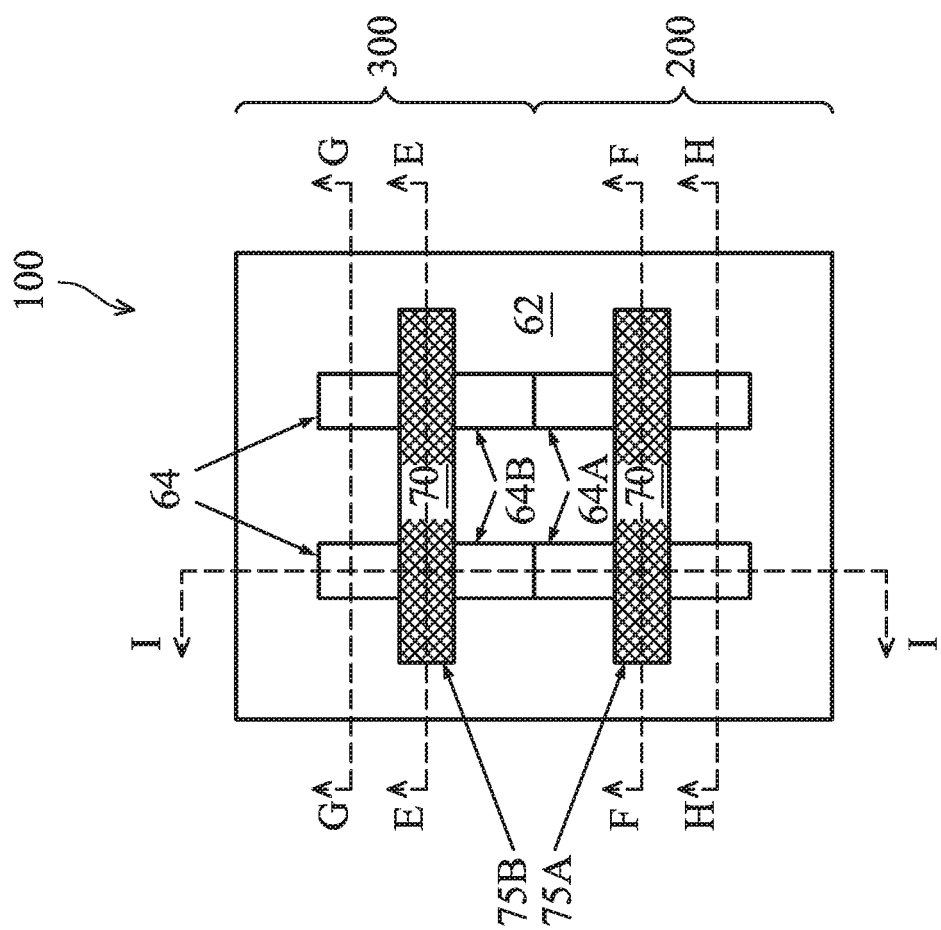

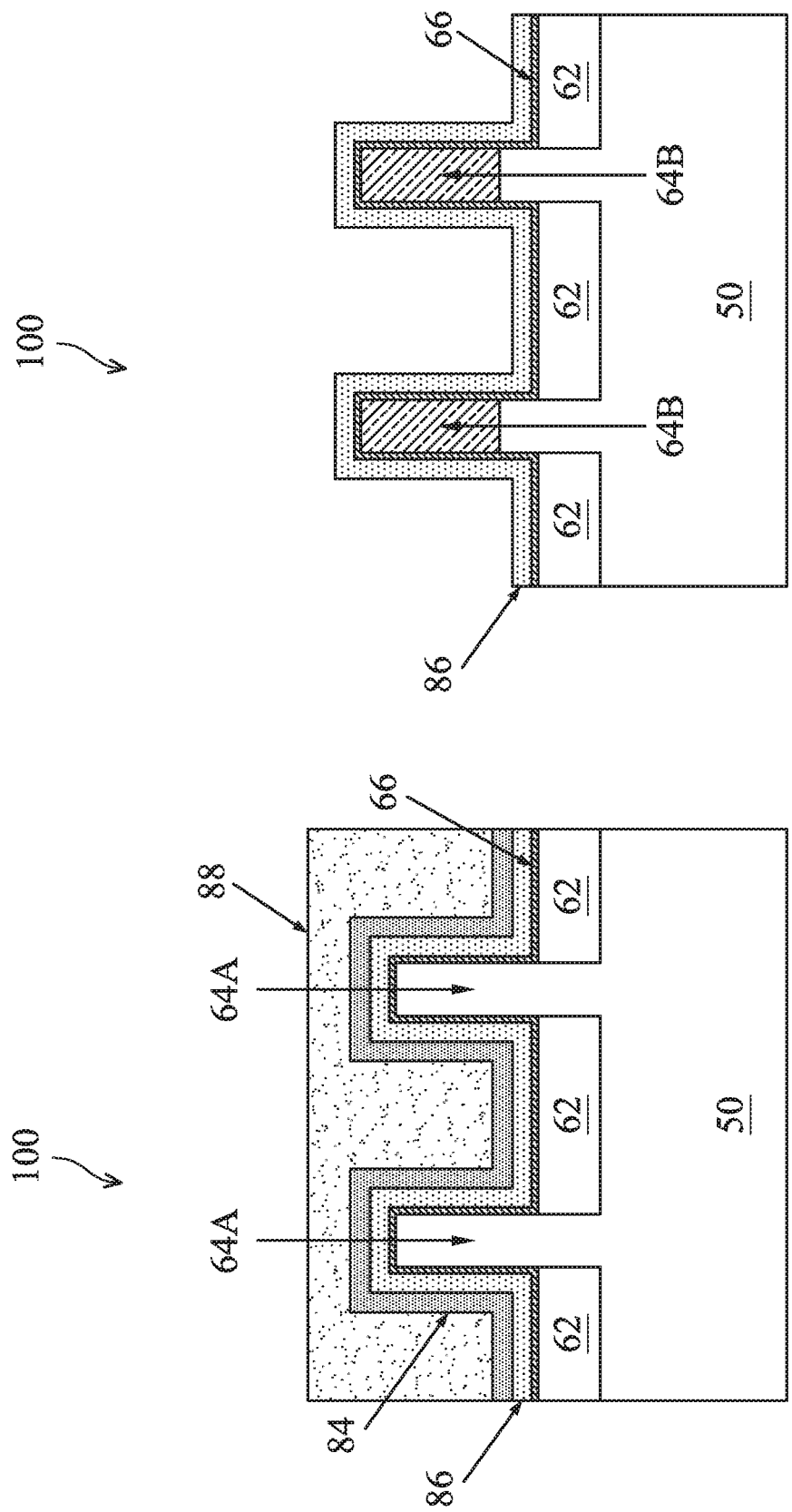

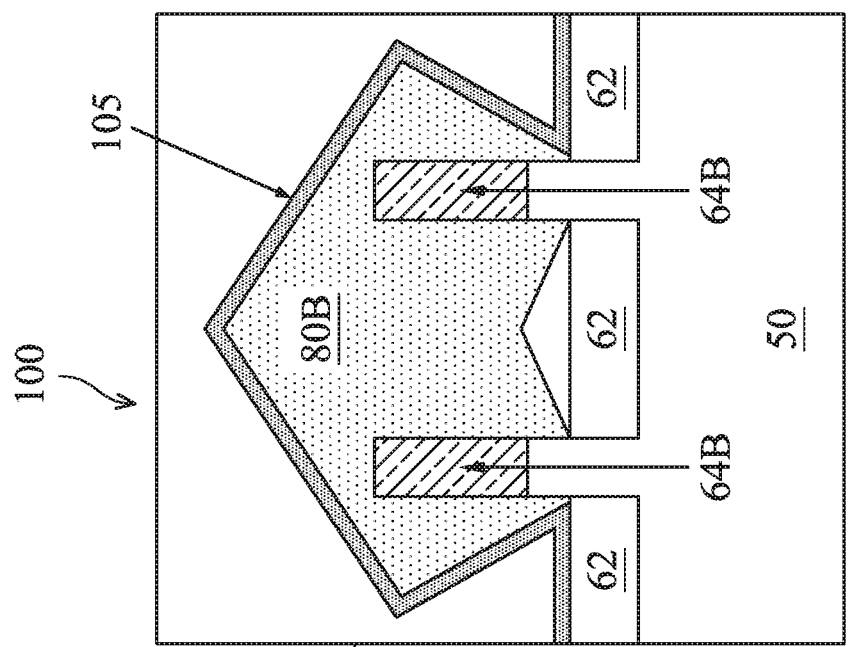
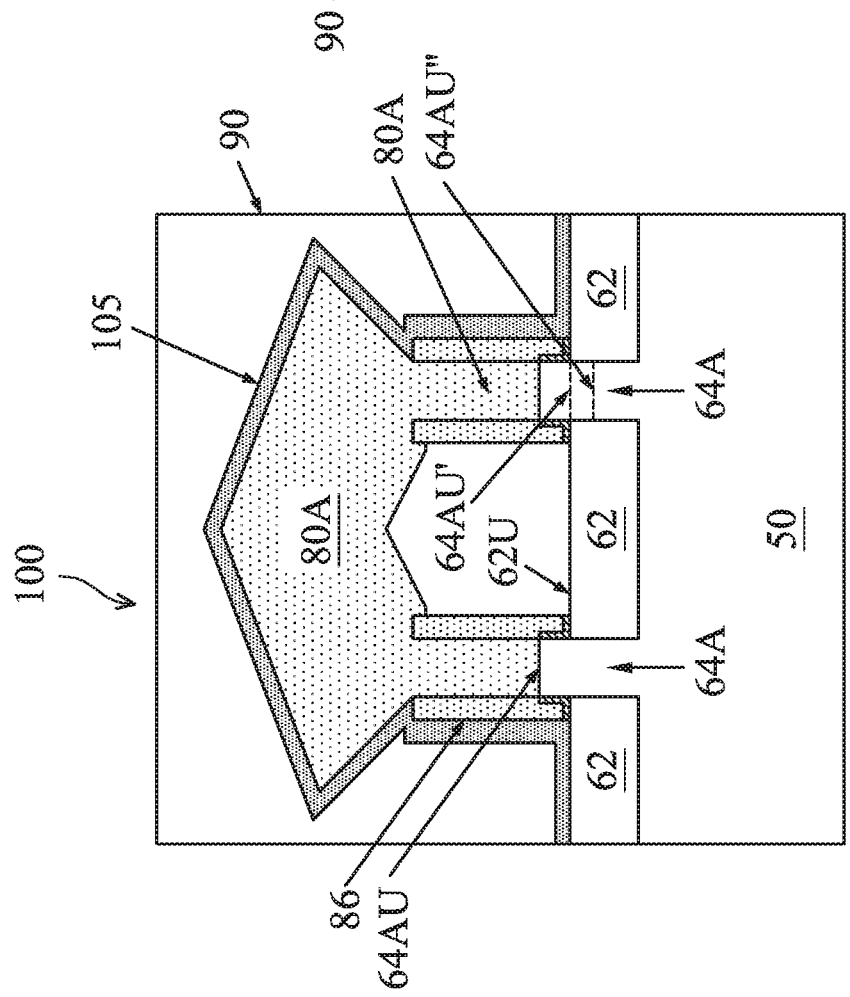
Figure 12C
Figure 12B

FIN FIELD-EFFECT TRANSISTOR DEVICE AND METHOD

PRIORITY CLAIM AND CROSS-REFERENCE

This application is a divisional of U.S. patent application Ser. No. 15/967,295, filed Apr. 30, 2018 and entitled "Fin Field-Effect Transistor Device and Method," which claims priority to U.S. Provisional Patent Application No. 62/592,871, filed Nov. 30, 2017, entitled "Fin Field-Effect Transistor Device and Method," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A-4C, 5A-5F, 6A-6C, 7A-7C, 8A-8C, 9A-9C, 10A-10C, 11A-11C, 12A-12C, and 13-16 are various views (e.g., plan views, cross-sectional views) of a FinFET device at various stages of fabrication, in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
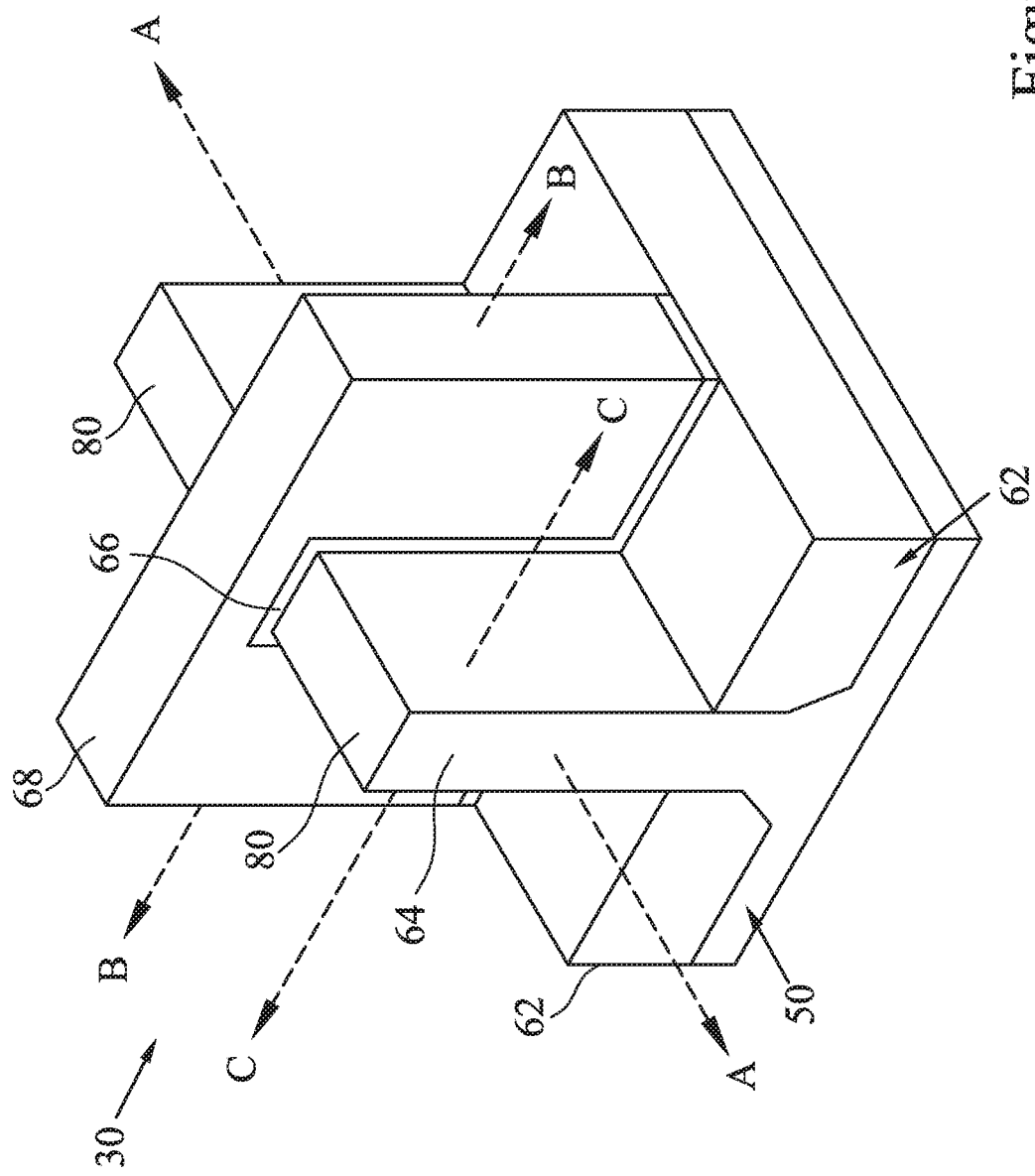
FIG. 1 illustrates a FinFET in a perspective view, in accordance with some embodiments.

FIG. 1 illustrates an example of a FinFET 30 in a perspective view. The FinFET 30 includes a substrate 50 and a fin 64 protruding above the substrate 50. The substrate 50 has isolation regions 62 formed thereon, and the fin 64 protrudes above and between neighboring isolation regions 62. A gate dielectric 66 is along sidewalls and over a top surface of the fin 64, and a gate 68 is over the gate dielectric 66. Source/drain regions 80 are in the fin on opposite sides of the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across a source/drain region 80 of the FinFET 30. Subsequent figures refer to these reference cross-sections for clarity.

FIGS. 2, 3A, 3B, 4A-4C, 5A-5F, 6A-6C, 7A-7C, 8A-8C, 9A-9C, 10A-10C, 11A-11C, 12A-12C, and 13-16 are various views (e.g., plan views, cross-sectional views) of a FinFET device 100 at various stages of fabrication in accordance with an embodiment. The FinFET device 100 is similar to the FinFET 30 in FIG. 1, but with multiple fins.

Figure 2:
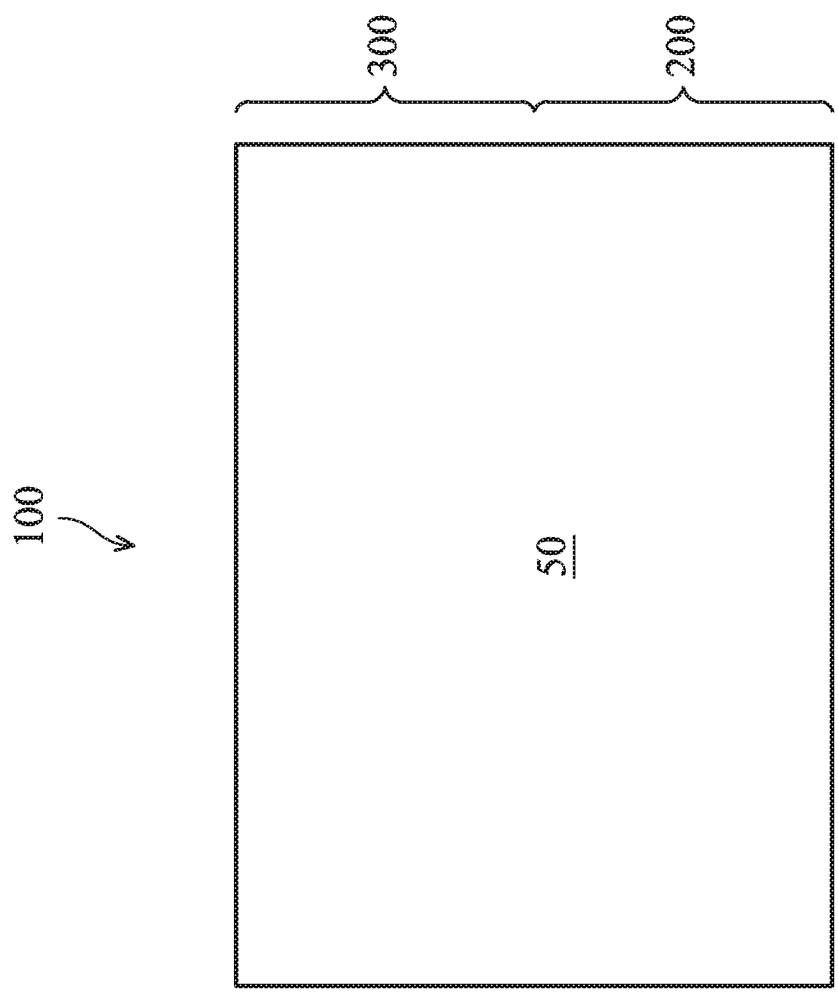

FIG. 2 illustrates a plan view of a substrate 50 used for fabricating the FinFET device 100. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate 50 includes a first portion in a region 200, and a second portion in a region 300. The first portion of the substrate 50 in the region 200 may be used to form N-type devices such as N-type metal-oxide-semiconductor field-effect transistors (MOSFETs), and the second portion of the substrate 50 in the region 300 may be used to form P-type devices such as P-type MOSFETs. Therefore, the region 200 may be referred to as an NMOS region of the substrate 50, and the region 300 may be referred to as a PMOS region of the substrate 50. In other embodiments, P-type devices (or N-type devices) are formed in both the region 200 and the region 300.

FIG. 3A illustrates the substrate 50 in FIG. 2, with a top portion of the substrate 50 in the region 300 replaced by a semiconductor material 50A. FIG. 3B illustrates a cross-sectional view of the structure in FIG. 3A along cross-section D-D.

Referring to FIGS. 3A and 3B, a portion of the substrate 50 in the region 300 is replaced with the semiconductor material 50A, such as an epitaxial semiconductor material that is suitable for forming a corresponding type of device (e.g., P-type device) in the region 300. For example, the semiconductor material 50A may be or comprise epitaxially grown silicon germanium. To form the semiconductor material 50A, a mask layer (not shown), which may be a photo-sensitive layer such as photoresist, is formed over the substrate 50 using chemical vapor deposition (CVD), physical vapor deposition (PVD), spin coating, or other suitable deposition method. The mask layer is then patterned using, e.g., photolithography and/or patterning techniques. The patterned mask layer covers the region 200 but exposes the region 300. An exposed portion of the substrate 50 in the region 300 is then removed by a suitable etching process, such as reactive ion etch (RIE), neutral beam etch (NBE), the like, or a combination thereof, to form a recess (not shown) in the region 300.

Next, an epitaxy is performed to grow the semiconductor material 50A in the recesses in the region 300. The epitaxially grown semiconductor material 50A may be in situ doped during growth, which may obviate the need for prior and subsequent implantations although in situ and implantation doping may be used together. After the epitaxy, the mask layer may be removed by a suitable removal process, such as etching or plasma ashing. A planarization process, such as chemical mechanical polish (CMP), may then be performed to level the top surface of the semiconductor material 50A with the top surface of the substrate 50. FIG. 3B shows an interface 63 between the semiconductor material 50A and the substrate 50, which may or may not be a straight line as illustrated in FIG. 3B.

Optionally, another patterned mask layer (not shown) may be formed to cover the region 300 while exposing the region 200, and an exposed portion of substrate 50 in the region 200 may be removed and replaced with an epitaxial grown semiconductor material 50B, which is illustrated in phantom in FIG. 3B. An interface 63' may be formed between the semiconductor material 50B (if formed) and the substrate 50. The semiconductor material 50B may be or comprise an epitaxial semiconductor material that is suitable for forming a corresponding type of device (e.g., N-type device) in the region 200. For example, the semiconductor material 50B may be or comprise epitaxially grown silicon carbide.

In other embodiments, the semiconductor material 50B (e.g., an epitaxial semiconductor material) replaces a portion of the substrate 50 in the region 200, and a portion of the substrate 50 in the region 300 may optionally be replaced by the semiconductor material 50A (e.g., an epitaxial semiconductor material). In yet other embodiments, the above described epitaxial semiconductor materials (e.g., 50A and 50B) are not formed, thus the processing illustrated in FIGS. 3A and 3B may be omitted. The discussion below use an embodiment configuration for the substrate 50 where the semiconductor material 50A is formed in the region 300 and the semiconductor material 50B is not formed in the region 200, with the understanding that the processing illustrated in the present disclosure may also be applied to other substrate configurations such as those described above. In the discussion hereinafter, substrate 51 is used to refer to substrate 50 and the semiconductor materials 50A/50B, if formed.

The semiconductor materials 50A or 50B (e.g., epitaxial semiconductor materials) may have a lattice constant greater than, substantially equal to, or smaller than, the lattice constant of substrate 50. The lattice constant of the semiconductor materials 50A or 50B is determined by the material(s) selected by the conductivity types (e.g., N-type or P-type) of the resulting FinFETs. Further, it may be advantageous to epitaxially grow a material in an NMOS region different from the material in a PMOS region. In various embodiments, the semiconductor materials (e.g., 50A, 50B) may comprise silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 4A:
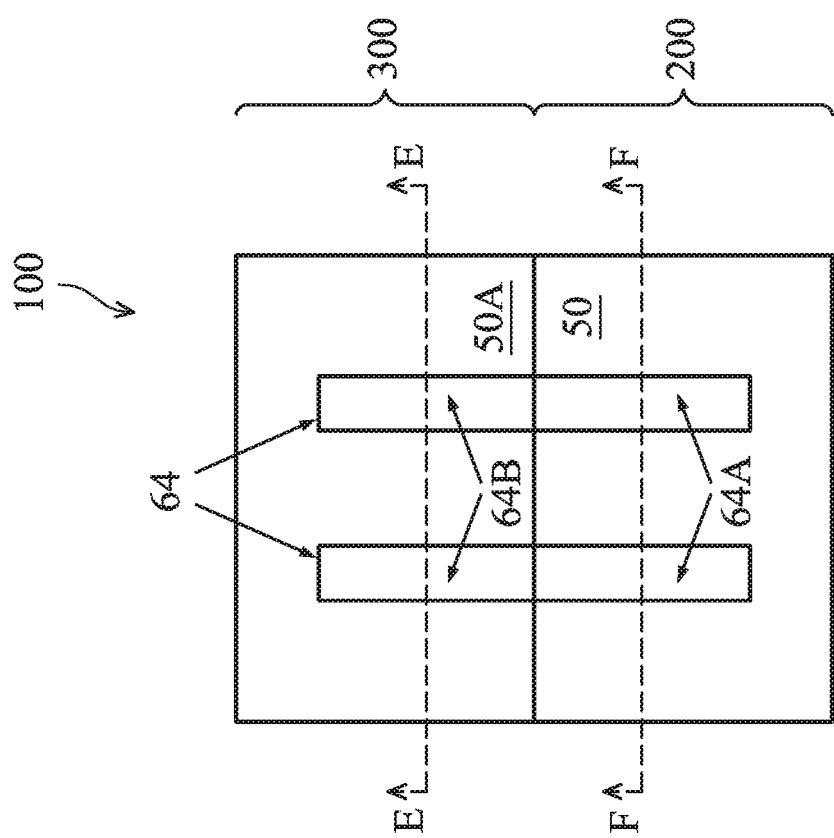
Figure 4C:
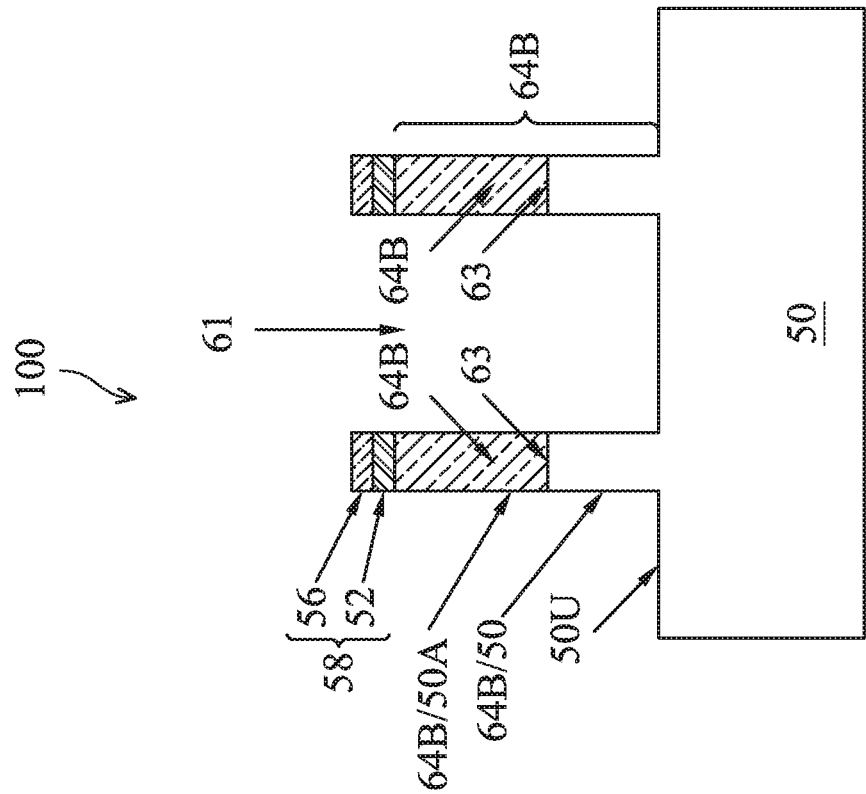
Figure 4B:
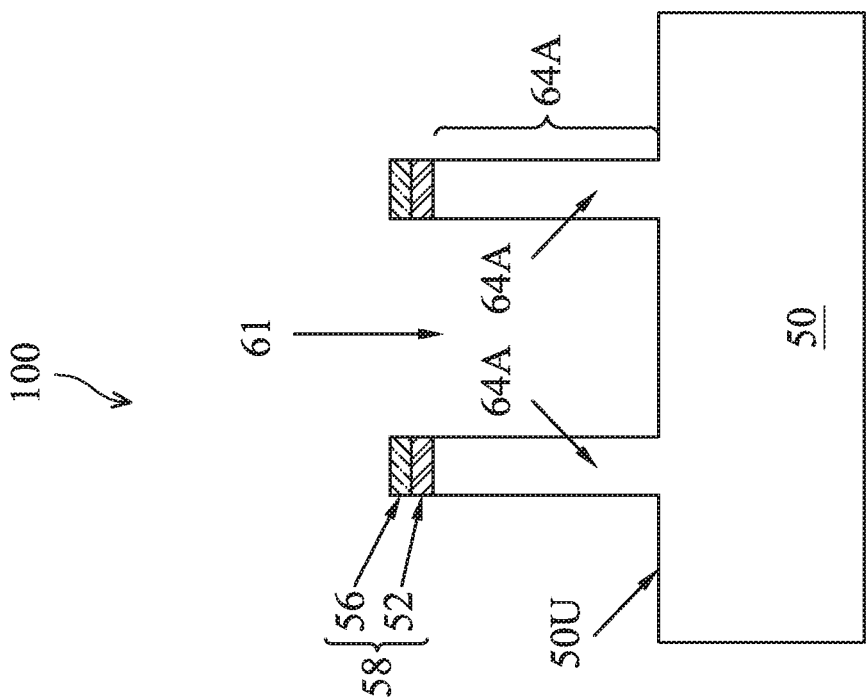

Next, as illustrated in FIGS. 4A-4C, the substrate 51 is patterned to form semiconductor fins 64 (also referred to as fins). FIG. 4A illustrates a plan view of the FinFET device 100 after the fins 64 are formed. FIGS. 4B and 4C illustrate cross-sectional views of the FinFET device 100 in FIG. 4A along cross-sections F-F and E-E, respectively. As illustrated in FIG. 4A, each fin 64 comprises a portion 64A in the region 200 and a portion 64B in the region 300. The portion 64A and the portion 64B may be formed in a same processing step (e.g., a same patterning process), details of which are described below with reference to FIGS. 4B and 4C.

Referring to FIGS. 4B and 4C, the substrate 51 is patterned using, e.g., photolithography and etching techniques. For example, a mask layer, such as a pad oxide layer (not shown) and an overlying pad nitride layer (not shown), is formed over the substrate 51. The pad oxide layer may be a thin film comprising silicon oxide formed, for example, using a thermal oxidation process. The pad oxide layer may act as an adhesion layer between the substrate 51 and the overlying pad nitride layer. In some embodiments, the pad nitride layer is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer and pad nitride to form a patterned mask 58. As illustrated in FIGS. 4B and 4C, the patterned mask 58 includes patterned pad oxide 52 and patterned pad nitride 56.

The patterned mask 58 is subsequently used to pattern the substrate 51 to form trenches 61, thereby defining semiconductor fins 64 between adjacent trenches as illustrated in FIGS. 4B and 4C. Each semiconductor fin 64 has a portion 64A (see FIG. 4A) in the region 200 (e.g., an NMOS region), and a portion 64B (see FIG. 4A) in the region 300 (e.g., a PMOS region). The portion 64A may be used to form, e.g., an N-type FinFET, and the portion 64B may be used to form, e.g., a P-type FinFET. In the discussion below, the portion 64A of the fin 64 may be referred to as a fin 64A, and the portion 64B of the fin 64 may be referred to as a fin 64B.

In some embodiments, the semiconductor fins 64 are formed by etching trenches in the substrate 51 using, for example, reactive ion etch (RIE), neutral beam etch (NBE), the like, or a combination thereof. The etch may be anisotropic. In some embodiments, the trenches may be strips (viewed from the top) parallel to each other, and closely spaced with respect to each other. In some embodiments, the trenches may be continuous and surround the semiconductor fins 64.

The fins 64 may be patterned by any suitable method. For example, the fins may 64 be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Recall that a top portion of the substrate 50 in the region 300 is replaced by the semiconductor material 50A. Therefore, depending on where the bottom of the trenches 61 is relative to the interface 63 between the semiconductor material 50A and the substrate 50 (e.g., at the interface 63, above the interface 63, or below the interface 63), the fins 64B may comprise one or more materials. In the example of FIG. 4C, the bottom of the trenches 61 extends below the interface 63, and therefore, the fin 64B has a first portion above the interface 63 formed of the semiconductor material 50A (e.g., silicon germanium), and a second portion below the interface 63 formed of the material (e.g., silicon) of the substrate 50. The fin 64A is formed entirely of the material (e.g., silicon) of the substrate 50, in the illustrated example of FIG. 4B. In other embodiments, the bottom of the trenches 61 extends above or at the interface 63, and therefore, the fin 64B is formed entirely of the semiconductor material 50A (e.g., silicon germanium), and the fin 64A is formed entirely of the material (e.g., silicon) of the substrate 50.

Variations in the structure and formation method of the fins 64 are possible and are fully intended to be included within the scope of the present disclosure. For example, although FIGS. 4A-4C illustrate two fins 64 being formed, more or less than two fins may be formed. As another example, the fins 64 may be formed by etching substrate 50 to form a first plurality of fins (at least portions of which will be removed and replaced in subsequent processing), forming an isolation material around the first plurality of fins, removing portions (e.g., portions in the region 300) of the first plurality of fins to form recesses in the isolation material, and epitaxially growing semiconductor material(s) in the recesses to form fins 64.

Figures 5B, 5C:
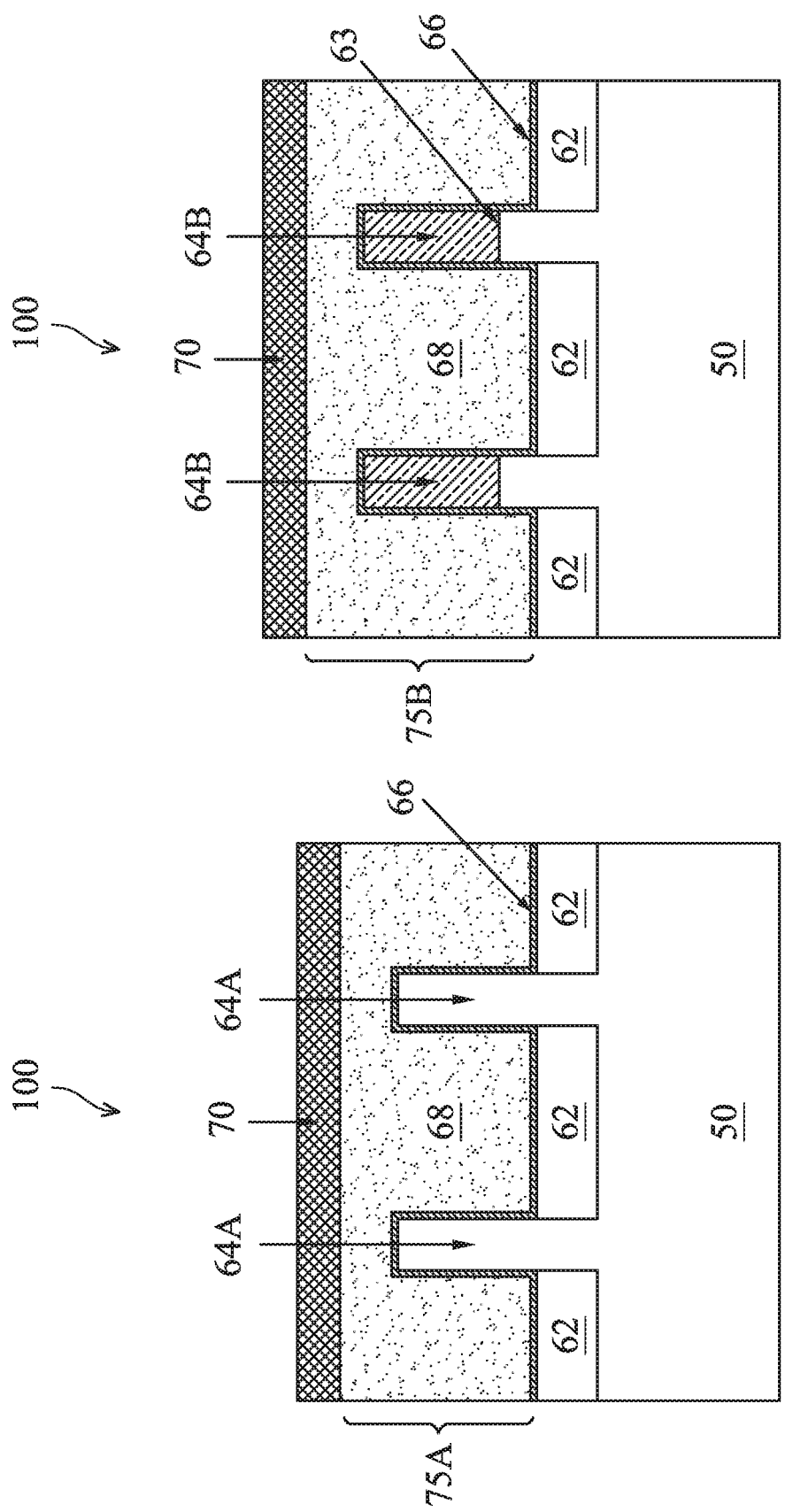
Figure 5E:
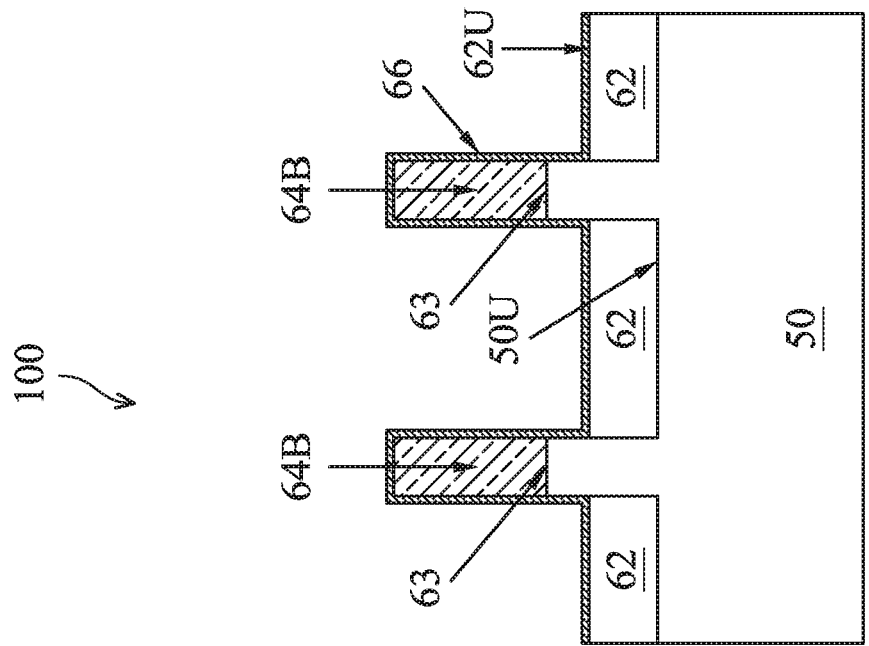
Figure 5D:
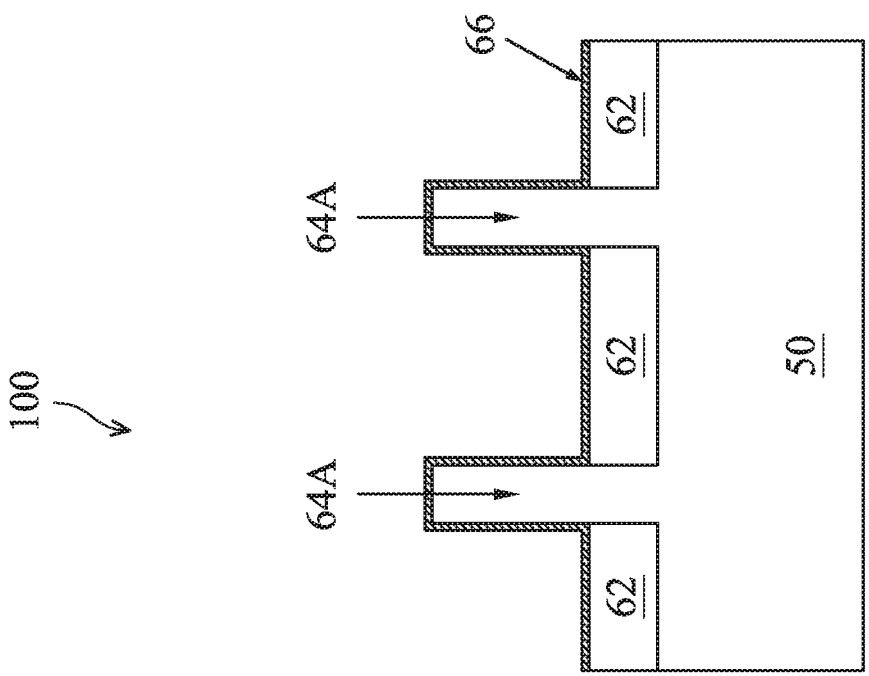
Figure 5F:
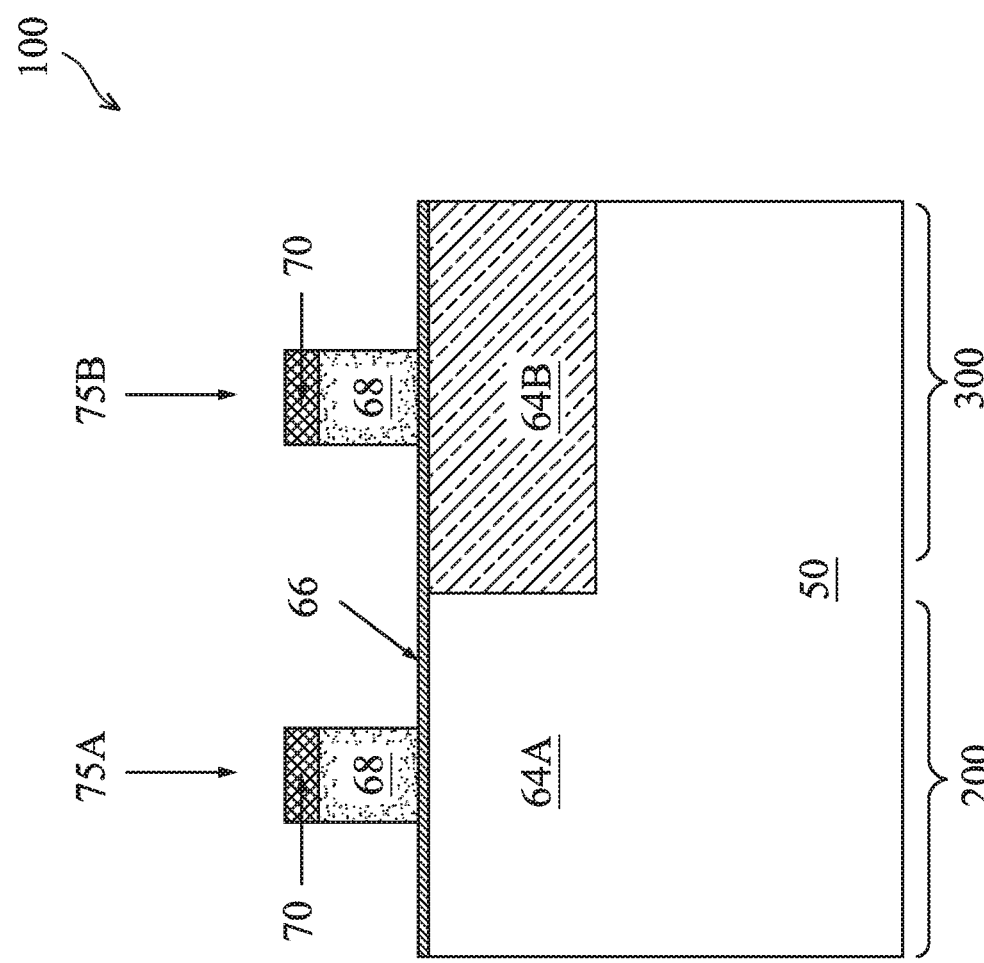

Next, as illustrated in FIGS. 5A-5F, isolation regions 62 are formed over the substrate 50 and on opposing sides of the fins 64, and dummy gate structures 75 (e.g., 75A and 75B) are formed over the fins 64. FIG. 5A is a plan view of the FinFET device 100, and FIGS. 5B and 5C are cross-sectional views of the FinFET device 100 in FIG. 5A along cross-sections F-F and E-E, respectively. FIGS. 5D and 5E are cross-sectional views of the FinFET device 100 in FIG. 5A along cross-sections H-H and G-G, respectively, and FIG. 5F is a cross-sectional view of the FinFET device 100 in FIG. 5A along cross-section I-I.

Referring to FIGS. 5B and 5C, isolation regions 62 are formed by filling the trenches 61 with an insulation material and recessing the insulation material. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. A planarization process, such as CMP, may remove excess insulation material and form a top surface of the isolation material and top surfaces of the semiconductor fins 64 that are coplanar (not shown). The patterned mask 58 (see FIGS. 4B and 4C) may be removed by the CMP process.

In some embodiments, the isolation regions 62 include a liner, e.g., a liner oxide (not shown), at the interface between the isolation regions 62 and the substrate 50/fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50 and/or fins 64, although any suitable method may also be used to form the liner oxide.

Next, the insulation material is recessed to form isolation regions 62 such as shallow trench isolation (STI) regions. The insulation material is recessed such that the upper portions of the semiconductor fins 64A/64B protrude from between neighboring isolation regions 62. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 5A-5C illustrate the formation of dummy gate structure 75 over the semiconductor fins 64. The dummy gate structure 75 includes gate dielectric 66 and gate 68, in some embodiments. To form the dummy gate structure 75, a dielectric layer is formed on the semiconductor fins 64 (e.g., 64A and 64B) and the isolation regions 62. The dielectric layer may be, for example, silicon oxide, silicon nitride, multilayers thereof, or the like, and may be deposited (as illustrated) or thermally grown (not shown) according to acceptable techniques. The formation methods of dielectric layer may include molecular-beam deposition (MBD), atomic layer deposition (ALD), plasma-enhanced CVD (PECVD), and the like.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 is then transferred to the gate layer and the dielectric layer by an acceptable etching technique to form gate 68 and gate dielectric 66, respectively, and the gate 68 and the gate dielectric 66 cover respective channel regions of the semiconductor fins 64, in some embodiments. In other embodiments, the pattern of the mask 70 is transferred to the gate layer to form gate 68, but not transferred to the dielectric layer. In other words, the dielectric layer is not patterned by the mask 70 in some embodiments, in which case the dielectric layer may be referred to as the gate dielectric 66 or as dielectric layer 66. Discussion hereinafter uses the example where the dielectric layer is not patterned by the mask 70, however, the principle of the present disclosure also applies to embodiments where the dielectric layer is patterned by the mask 70. The gate 68 may have a lengthwise direction substantially perpendicular to the lengthwise direction of respective semiconductor fins 64. As illustrated in FIG. 5A, the gate structure 75A is formed over the fins 64A in the region 200, and the gate structure 75B is formed over the fins 64B in the region 300.

FIGS. 5D and 5E illustrate cross-sectional views of the FinFET device 100 of FIG. 5A along cross-section H-H and G-G, respectively. The gate structure 75A and 75B may not be visible in this cross-section. In the example of FIG. 5E, the interface 63 extends further away from a major upper surface 50U of the substrate 50 than an upper surface 62U of the isolation regions 62.

FIG. 5F illustrates a cross-sectional view of the FinFET device 100 of FIG. 5A along cross-section I-I. As illustrated in FIG. 5F, gate structure 75A is formed over the fin 64A in the region 200, and the gate structure 75B is formed over the fin 64B in the region 300.

FIGS. 6A-6C, 7A-7C, 8A-8C, 9A-9C, 10A-10C, 11A-11C, and 12A-12C illustrate further processing of the FinFET device 100 shown in FIGS. 5A-5F. In particular, FIGS. 6A, 7A, 8A, 9A, 10A, 11A and 12A illustrate cross-sectional views of the FinFET device 100 along cross-section I-I (see FIG. 5A) at various stages of fabrication. FIGS. 6B, 7B, 8B, 9B, 10B, 11B and 12B illustrate the corresponding cross-sectional views of the FinFET device 100 along cross-section H-H (see FIG. 5A), and FIGS. 6C, 7C, 8C, 9C, 10C, 11C and 12C illustrate the corresponding cross-sectional views of the FinFET device 100 along cross-section G-G (see FIG. 5A).

Figure 6A:
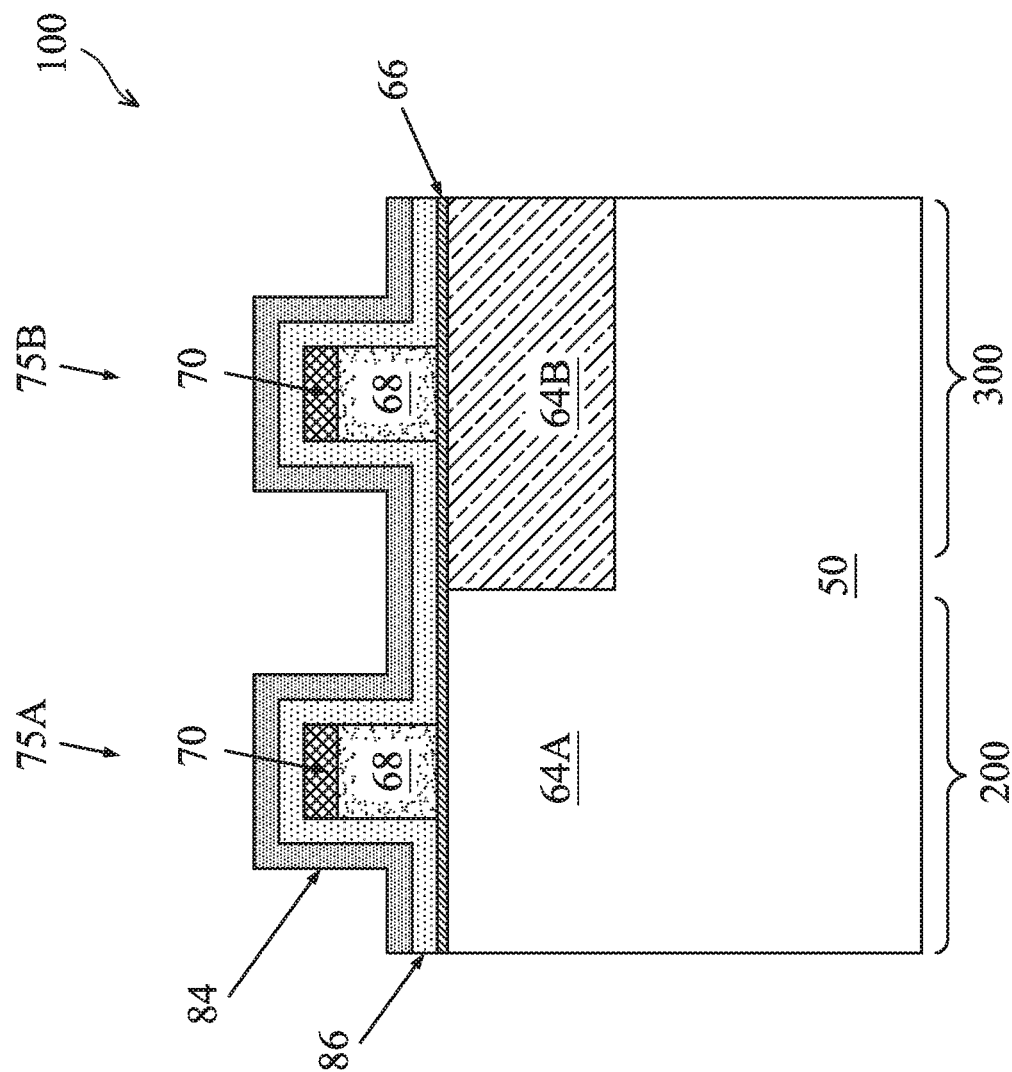
Figure 6C:
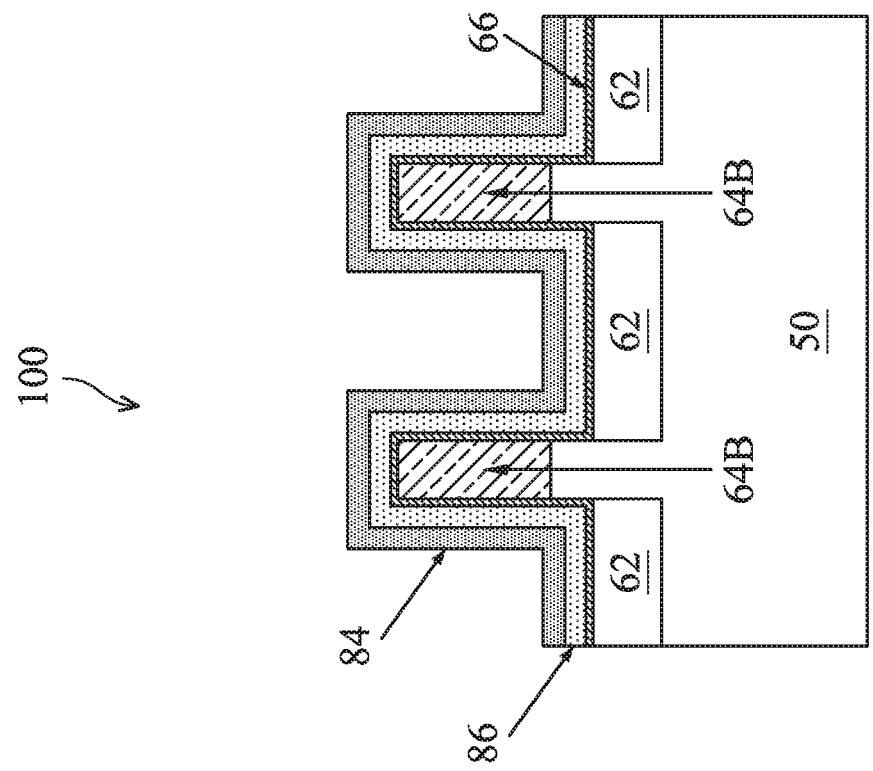
Figure 6B:
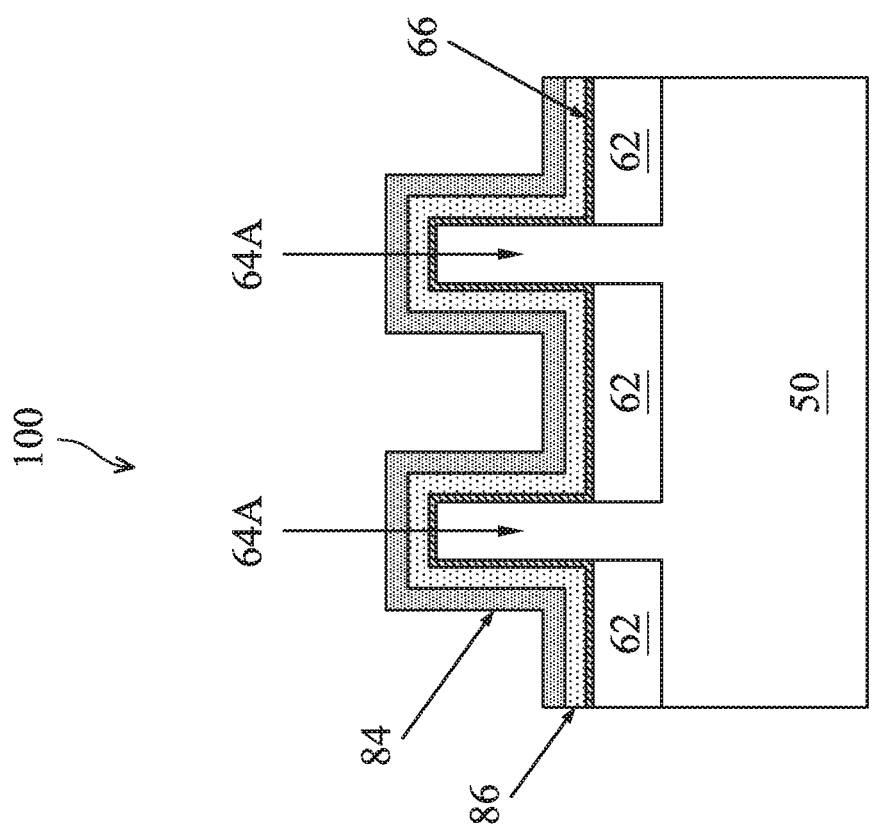

Next, as illustrated in FIGS. 6A-6C, a first spacer layer 86 and a second spacer layer 84 are formed successively over the structure illustrated in FIGS. 5A-5F. The first spacer layer 86 and the second spacer layer 84 may be formed conformally. In some embodiments, the first spacer layer 86 comprises a low-K dielectric material, and thus, may be referred to as a low-K spacer layer. The first spacer layer 86 may be formed of a suitable material such as silicon oxycarbide (SiOC), silicon oxycarbonitride (SiOCN), or silicon carbonitride (SiCN). A thickness of the first spacer layer 86 may be in a range between about 2 nm to about 5 nm. In some embodiments, the second spacer layer 84 comprises a nitride-rich dielectric material. The second spacer layer 84 may be formed of a suitable material such as silicon nitride (SiN) or silicon carbonitride (SiCN). A thickness of the second spacer layer 84 may be in a range between about 3 nm to about 5 nm. Any suitable deposition methods, such as PVD, CVD, and ALD, may be used to form the first spacer layer 86 and the second spacer layer 84.

In accordance with some embodiments, a first material of the first spacer layer 86 is chosen to be different from a second material of the second spacer layer 84 to provide etch selectivity between the first spacer layer 86 and the second spacer layer 84 in subsequent processing. For example, when the second spacer layer 84 is formed of SiN, the first spacer layer 86 may be formed of SiOC, SiOCN, or SiCN. As another example, when the second spacer layer 84 is formed of SiCN, the first spacer layer 86 may be formed of SiOC or SiOCN.

Figure 7A:
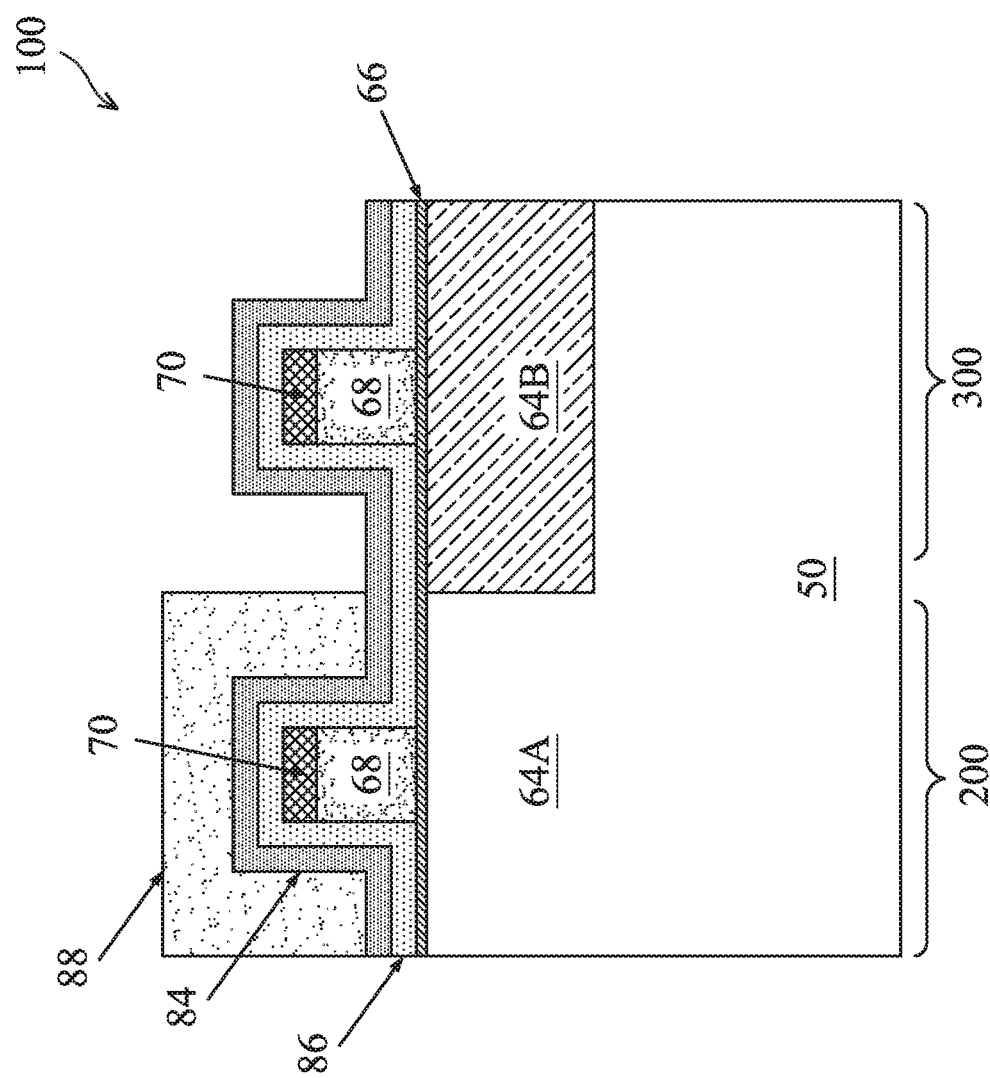
Figure 7C:
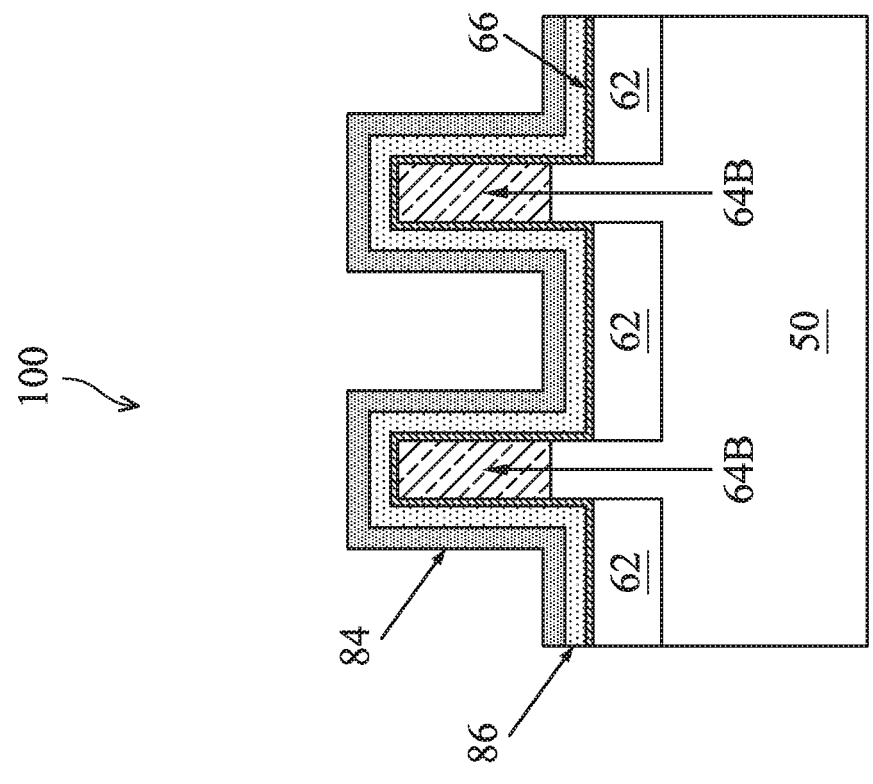
Figure 7B:
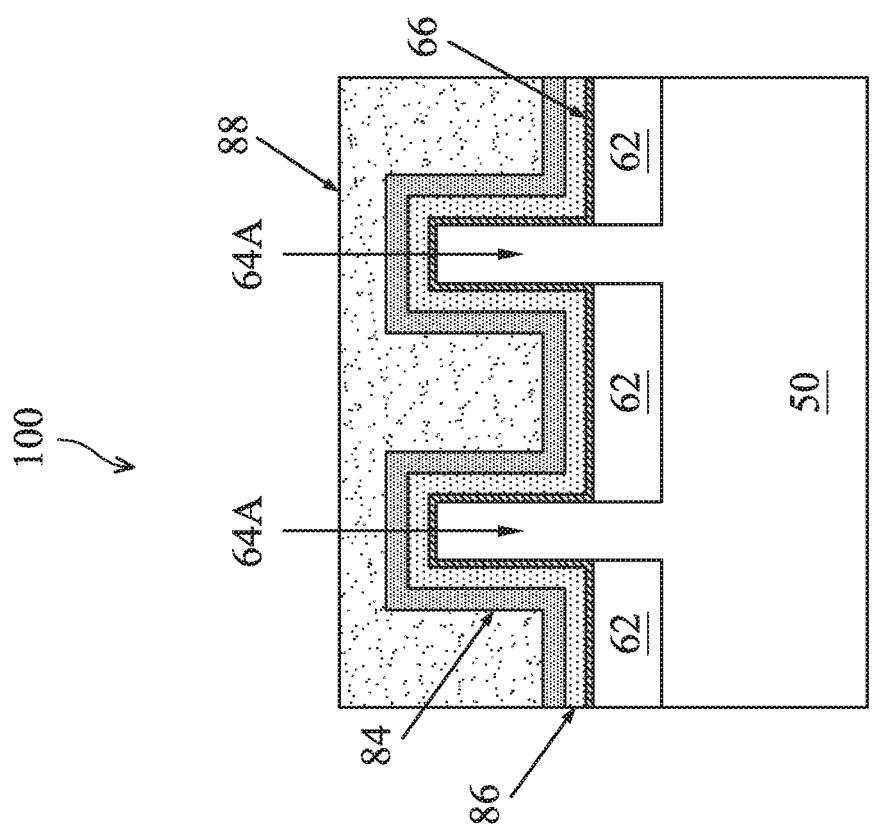

Next, as illustrated in FIGS. 7A-7C, a mask layer, which may be a photo-sensitive layer such as photoresist, is formed over the structure shown in FIGS. 6A-6C using CVD, PVD, spin coating, or other suitable deposition method. The mask layer is then patterned using, e.g., photolithography and/or patterning techniques to form a patterned mask 88. The patterned mask 88 covers the region 200 but exposes the region 300, as illustrated in FIGS. 7A-7C. Therefore, the patterned mask 88 shields the region 200 from the subsequent etching processes described with reference to FIGS. 8A-8C and 9A-9C.

Figure 8A:
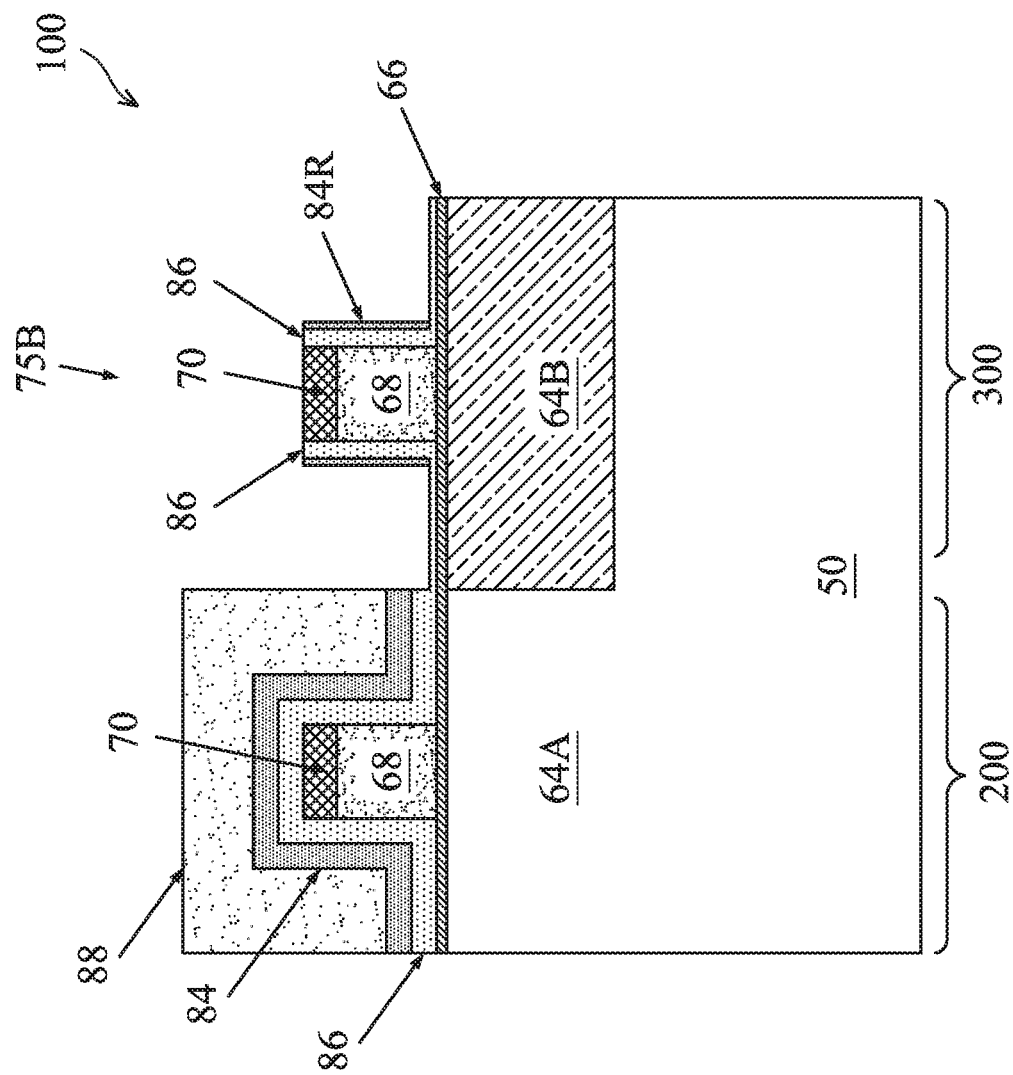

Next, as illustrated in FIGS. 8A-8C, an etching process is performed to remove portions of the second spacer layer 84 in the region 300. In some embodiments, the etching process used to remove portions of the second spacer layer 84 is an anisotropic etching process, such as a dry etch process. For example, a plasma etch process using carbon monoxide (CO), tetrafluoromethane ($CF_4$), oxygen ($O_2$), ozone ($O_3$), or combinations thereof, may be performed to remove the exposed second spacer layer 84 in the region 300 (e.g., a PMOS region). In some embodiments, the plasma etch process has a high etching selectivity (e.g., having a higher etching rate) for the second spacer layer 84 over the first spacer layer 86. In some embodiments, the plasma (e.g., $CF_4$ plasma) used in the plasma etch process chemically reacts with the second spacer layer 84 to remove the second spacer layer 84. In some embodiments, the anisotropic etching process removes the second spacer layer 84 over a top surface and sidewalls of the fins 64B (see FIG. 8C), such that the first spacer layer 86 over the top surface and the sidewalls of the fins 64B is exposed. The anisotropic etching process may also remove upper portions of the first spacer layer 86 in the region 300. As illustrated in FIG. 8A, the anisotropic etching process removes portions of the second spacer layer 84 and portions of the first spacer layer 86 over the top surface of the gate structure 75B (e.g., over the mask 70), such that the mask 70 is exposed. In addition, the first spacer layer 86 over the top surface of the fins 64B may be thinned (see FIG. 8A) or removed (not shown).

Due to the anisotropy of the plasma etch processing (e.g., DC bias used), and/or due to byproduct (e.g., polymer) being formed on the sidewalls of the gate structure 75B during the plasma etching process, portions of the second spacer layer 84 (e.g., 84R) along the sidewalls of the gate structure 75B remain (e.g., due to the protection provided by the byproduct of the plasma etching process) after the plasma etch process, as illustrated in FIG. 8A. The remaining portions 84R of the second spacer layer 84 along the sidewalls of the gate structure 75B advantageously protects portions of the first spacer layer 86 disposed between the remaining portions 84R and the gate structure 75B from a subsequent etching process, such that the portions of the first spacer layer 86 between the remaining portion 84R and the gate structure 75B remain after the subsequent etching process to serve as the spacers of the gate structure 75B.

In an exemplary embodiment, the anisotropic etching process is a plasma etch process comprising a first plasma etch step followed by a second plasma etch step. The first plasma etch step is performed using tetrafluoromethane ($CF_4$), and the second plasma etch step is performed using oxygen ($O_2$). In some embodiments, the first plasma etching step may produce byproducts such as polymer, which polymer covers the top surface and the sidewalls of the gate structure 75B, thus advantageously reducing or preventing damage (e.g., etching of the sidewalls of the gate structure) to the gate structure 75B during the first plasma etch step. After the first plasma etch step, the $O_2$ plasma used in the second plasma etch step removes the polymer byproduct produced by the first plasma etch step.

In some embodiments, the first plasma etch step and the second plasma etch step of the plasma etch process are performed at a same temperature and under a same pressure. In some embodiments, a temperature of the plasma etch process is in a range between about 30° C. to about 65° C., and a pressure of the plasma etch process is in a range between about 4 millitorr (mTorr) to about 50 mTorr. A flow rate of $CF_4$ in the first plasma etch step may be in a range between about 100 standard cubic center meters per minute (sccm) to about 200 sccm. A flow rate of $O_2$ in the second plasma etch step may be in a range between about 100 sccm to about 200 sccm. Carrier gas, such as nitrogen, argon, or the like, may be used to carry the plasma. Each cycle of the first plasma etch step may be performed for a duration in a range between about 5 seconds and about 15 seconds. Each cycle of the second plasma etch step may be performed for a duration in a range between about 5 seconds and about 15 seconds. The number of cycles in the first plasma etch step and in the second plasma etch step may depend on, e.g., the thickness of the spacer layer (e.g., 84) to be removed.

Figure 9A:
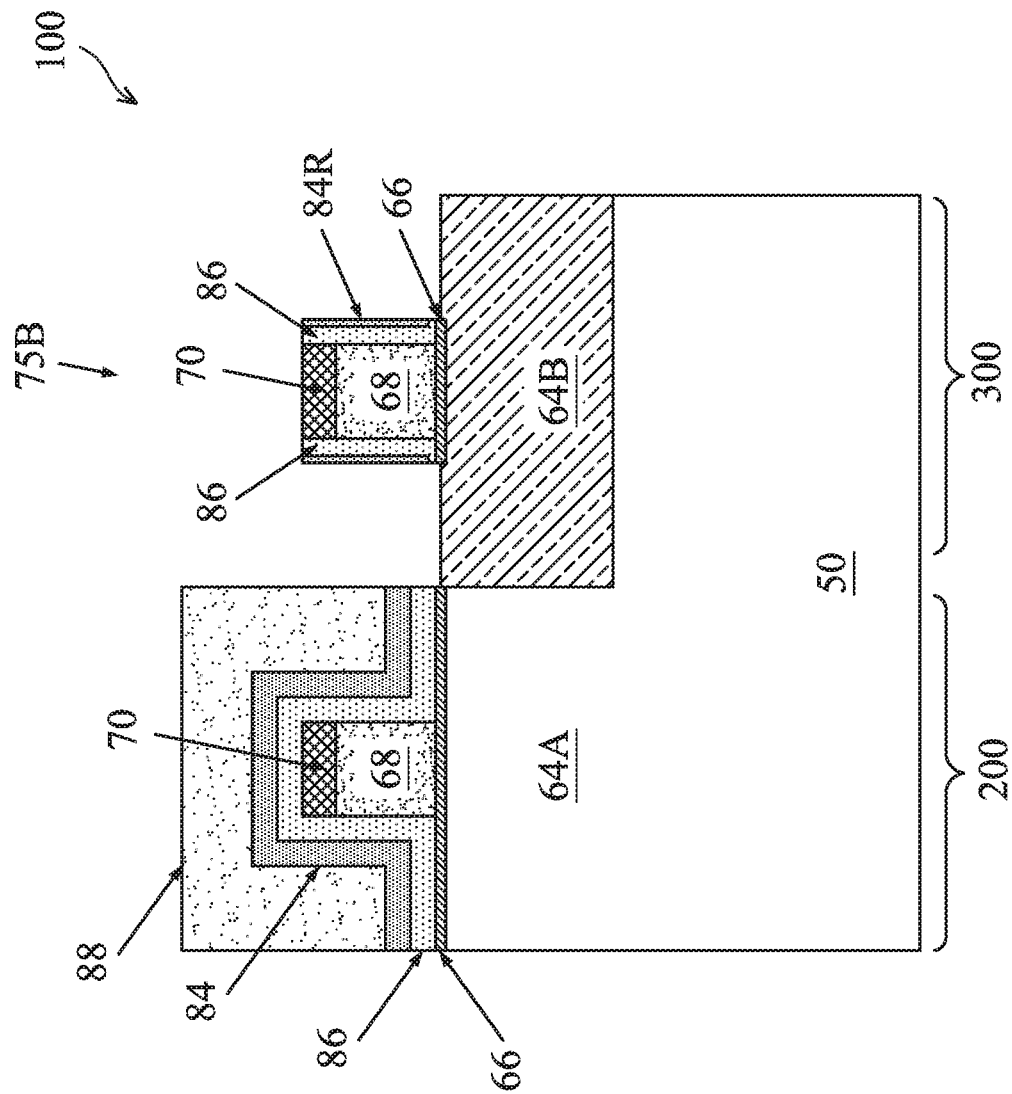
Figure 9C:
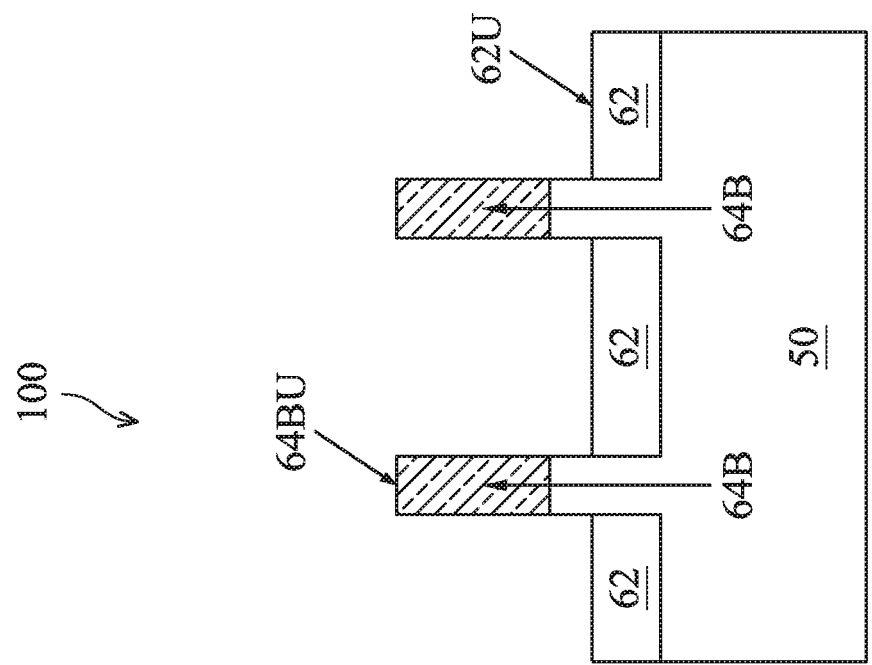
Figure 9B:
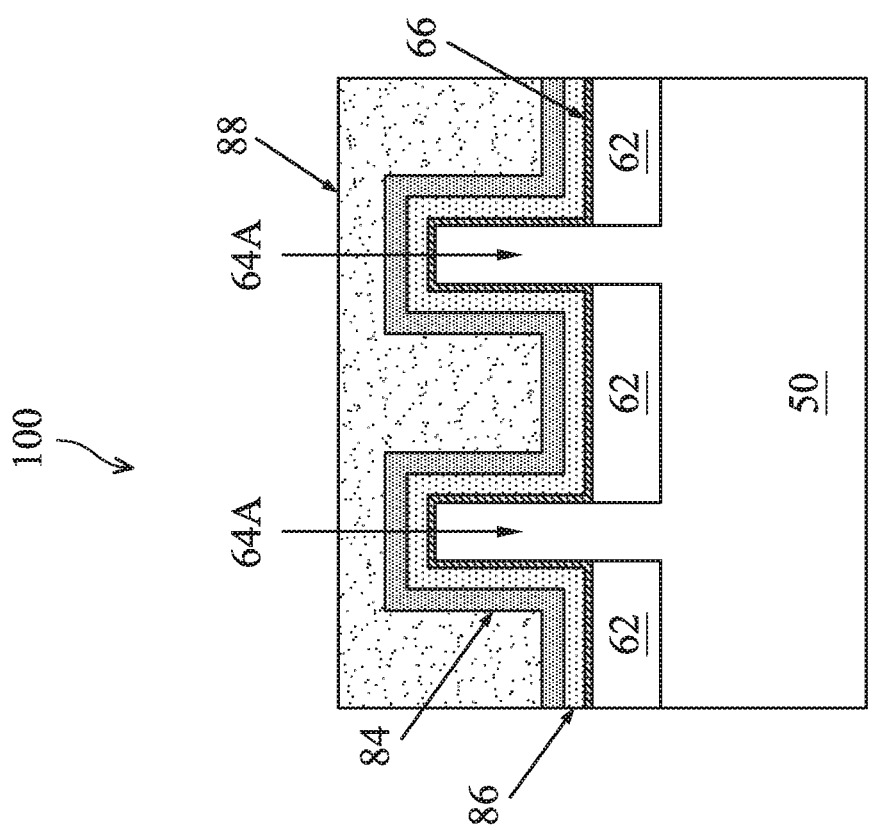

Next, as illustrated in FIGS. 9A-9C, another etching process is performed to remove portions of the first spacer layer 86 in the region 300. In some embodiments, the another etching process used to remove the first spacer layer 86 is a wet etch process, e.g., a chemical etch process using an etchant. The etchant may have a high etching selectivity (e.g., having a higher etching rate) for the first spacer layer 86 over the second spacer layer 84. Therefore, the first spacer layer 86 may be removed without substantially attacking the second spacer layer 84 (e.g., 84R). For example, a wet etch process using diluted hydrofluoric acid (dHF), hydrogen peroxide ($H_2O_2$), ozone ($O_3$), phosphoric acid ($H_3PO_4$), a standard (STD) clean fluid (which is a mixture comprising deionized water (DIW), ammonium hydroxide ($NH_4OH$), and hydrogen peroxide ($H_2O_2$)), or combinations thereof, may be performed to remove the exposed first spacer layer 86 in the region 300. In some embodiments, the wet etch process completely removes the exposed first spacer layer 86 in the region 300, such that a top surface 64BU of the fins 64B and sidewalls of the fins 64B (e.g., sidewalls of the fins 64B above the upper surface 62U of the isolation regions 62) are exposed after the wet etch process, as illustrated in FIG. 9C. Note that due to the remaining portion 84R of the second spacer layer 84, portions of the first spacer layer 86 along the sidewalls of the gate structure 75B remain after the wet etch process.

In some embodiments, the wet etch process comprises a first step, a second step, a third step and a fourth step performed sequentially. In other words, the second step of the wet etch process is performed after the first step of the wet etch process, the third step of the wet etch process is performed after the second step of the wet etch process, and the fourth step of the wet etch process is performed after the third step of the wet etch process. In particular, the first step is performed using a mixture comprising hydrogen peroxide ($H_2O_2$) and ozone ($O_3$), the second step is performed using diluted hydrofluoric acid (dHF), the third step is performed using phosphoric acid ($H_3PO_4$), and the fourth step is performed using the STD clean fluid, which is a mixture comprising deionized water (DIW), ammonium hydroxide ($NH_4OH$), and hydrogen peroxide ($H_2O_2$). By performing the first step, the second step, the third step, and the fourth step as described above, the removal process of the first spacer layer 86 can be controlled accurately.

Figure 10A:
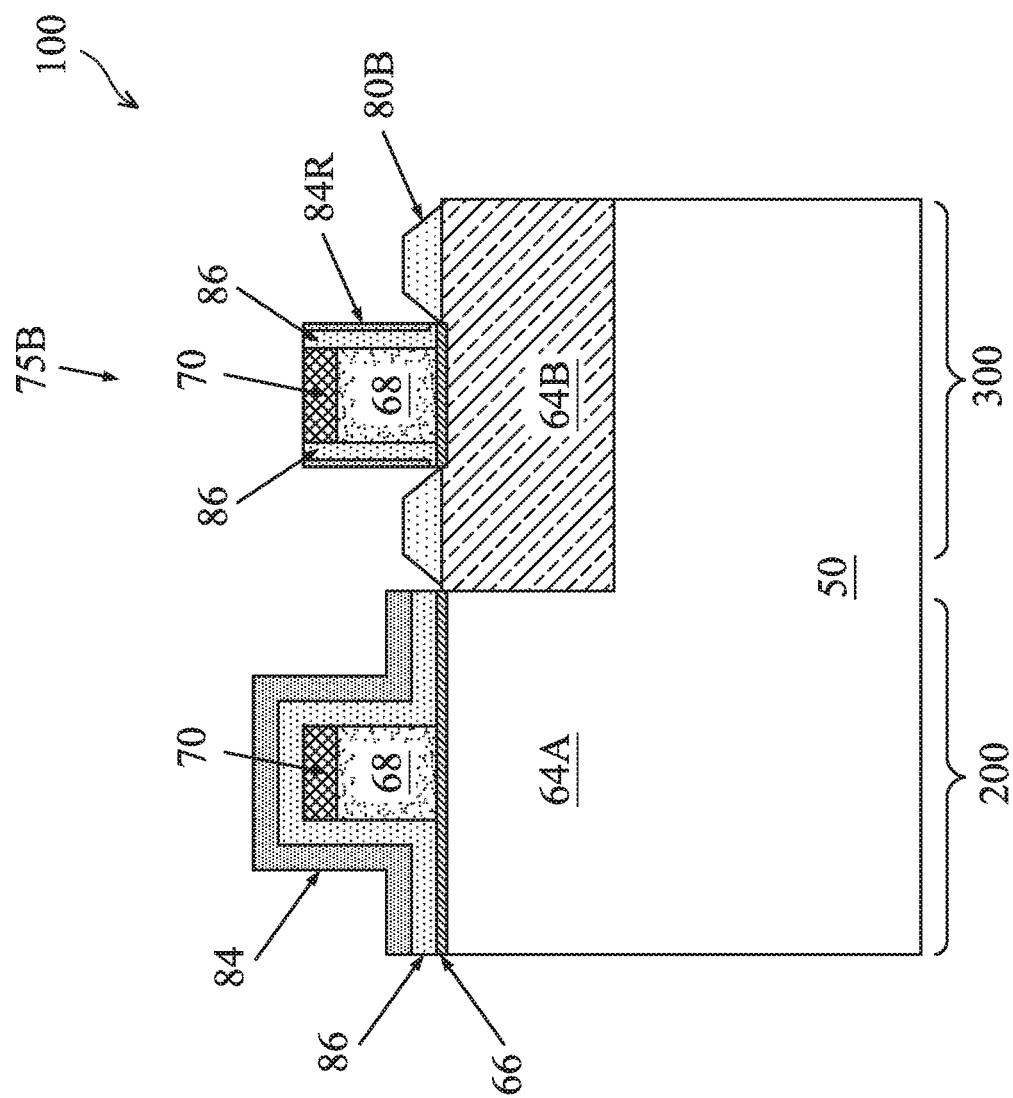
Figure 10C:
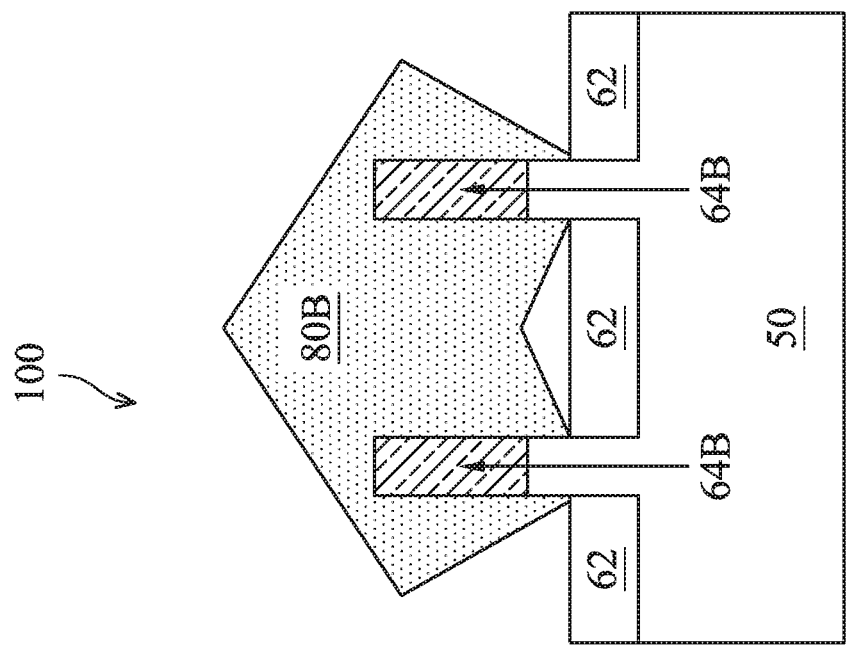
Figure 10B:
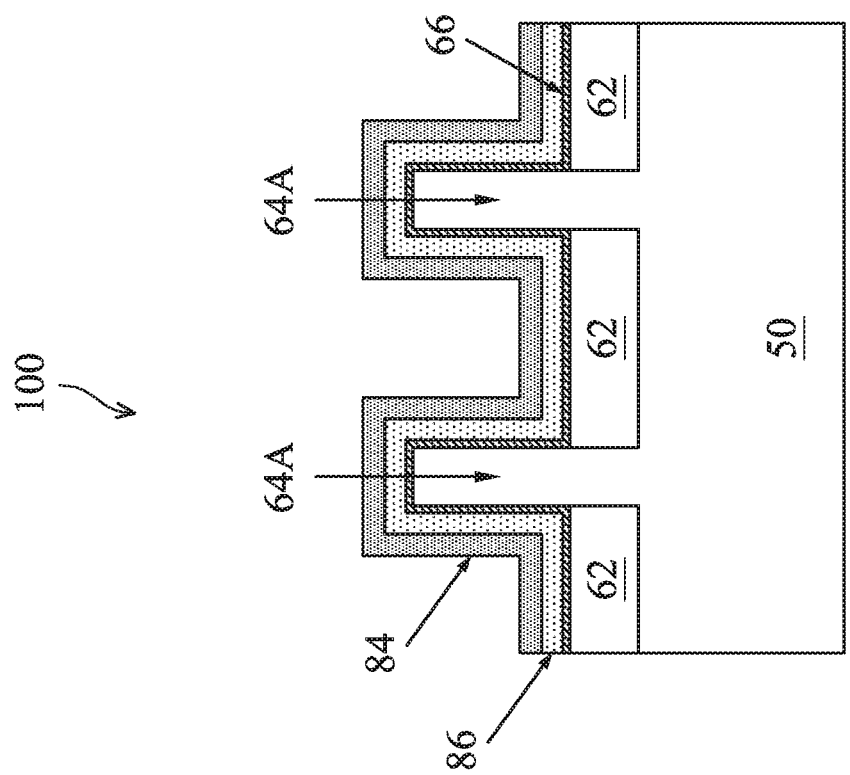

Next, as illustrated in FIGS. 10A-10C, epitaxial source/drain regions 80B are formed over the exposed top surface 64BU (see FIG. 9C) and the exposed sidewalls of the fins 64B, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxial source/drain regions 80B may have surfaces raised from the top surfaces of the fins 64B and may have facets. As illustrated in FIG. 10C, the source/drain regions 80B of the adjacent fins 64B merge to form a continuous epitaxial source/drain region 80B. After the epitaxial source/drain regions 80B are formed, the patterned mask 88 is removed using a suitable process, such as ashing.

Although not illustrated in FIGS. 10A-10C, light doped drain (LDD) regions may be formed in the fins 64B before the epitaxial source/drain regions 80B are formed. LDD regions may be formed by a plasma doping process. The plasma doping process may implant a corresponding type of impurities, such as P-type impurities (for P-type devices) in the fins 64B to form the LDD regions. For example, the patterned mask 88 may shield the region 200 (e.g., an NMOS region) while P-type impurities are implanted into the LDD regions of the fins 64B.

In some embodiments, the resulting FinFET in the region 300 is a p-type FinFET, the source/drain regions 80B comprise SiGe and a p-type impurity such as boron or indium. The epitaxial source/drain regions 80B may be implanted with dopants followed by an anneal. The source/drain regions 80B may have an impurity (e.g., dopant) concentration in a range from about $1E19$ $cm^{-3}$ to about $1E21$ $cm^{-3}$. In some embodiments, the epitaxial source/drain regions 80B may be in situ doped during growth.

The epitaxial source/drain regions 80B are formed directly on the exposed top surface 64BU (see FIG. 9C) and the exposed sidewalls of the fins 64B. This is different from the process to form the epitaxial source/drain regions 80A discussed below with reference to FIGS. 11A-11C. The epitaxial source/drain regions 80B formed by the processing in the present disclosure is referred to as having a cladding epitaxy structure.

Due to the multi-layer structure (e.g., first spacer layer 86 and the second spacer layer 84) for the spacer layers and due to the specific etching process (e.g., dry etch followed by wet etch as discussed above) disclosed, the first spacer layer 86 and the second spacer layer 84 over the top surface and the sidewalls of the fins 64B are completely removed. As a result, the epitaxial source/drain regions 80B may have a large volume, which results in improves device performance, such as lower drain induced barrier loss (DIBL), larger ON-current $I_{on}$, lower contact resistance for subsequently formed source/drain contacts, and improved device reliability, as examples. In addition, damage to the gate structure 75B and the fins 64B are reduced. For example, fin top loss is reduced, damage (e.g., etching) of the sidewalls of the fins 64B is reduced, and the critical dimension (CD) of the fins 64B are better controlled. As another example, since portions of the first spacer layer 86 and the second spacer layer 84 (e.g., 84R) on sidewalls of the gate structure 75B remain after the above disclosed etching process, damage to the gate structure 75B is reduced or avoided, and the thickness of the gate structure 75B is well controlled. Furthermore, the presently disclosed structure and method reduces the loading effect between inner portions (e.g., portions between adjacent fins 64B) of the isolation regions 62 and outer portions (e.g., portions not between adjacent fins 64B) of the isolation regions 62. For example, by using the presently disclosed multi-layer structure for the spacer layer and the specific etching process, a distance between an upper surface of the inner portions of the isolation regions 62 and an upper surface of the outer portions of the isolation regions 62 may be reduced from 25 nm to 5 nm.

Figure 11A:
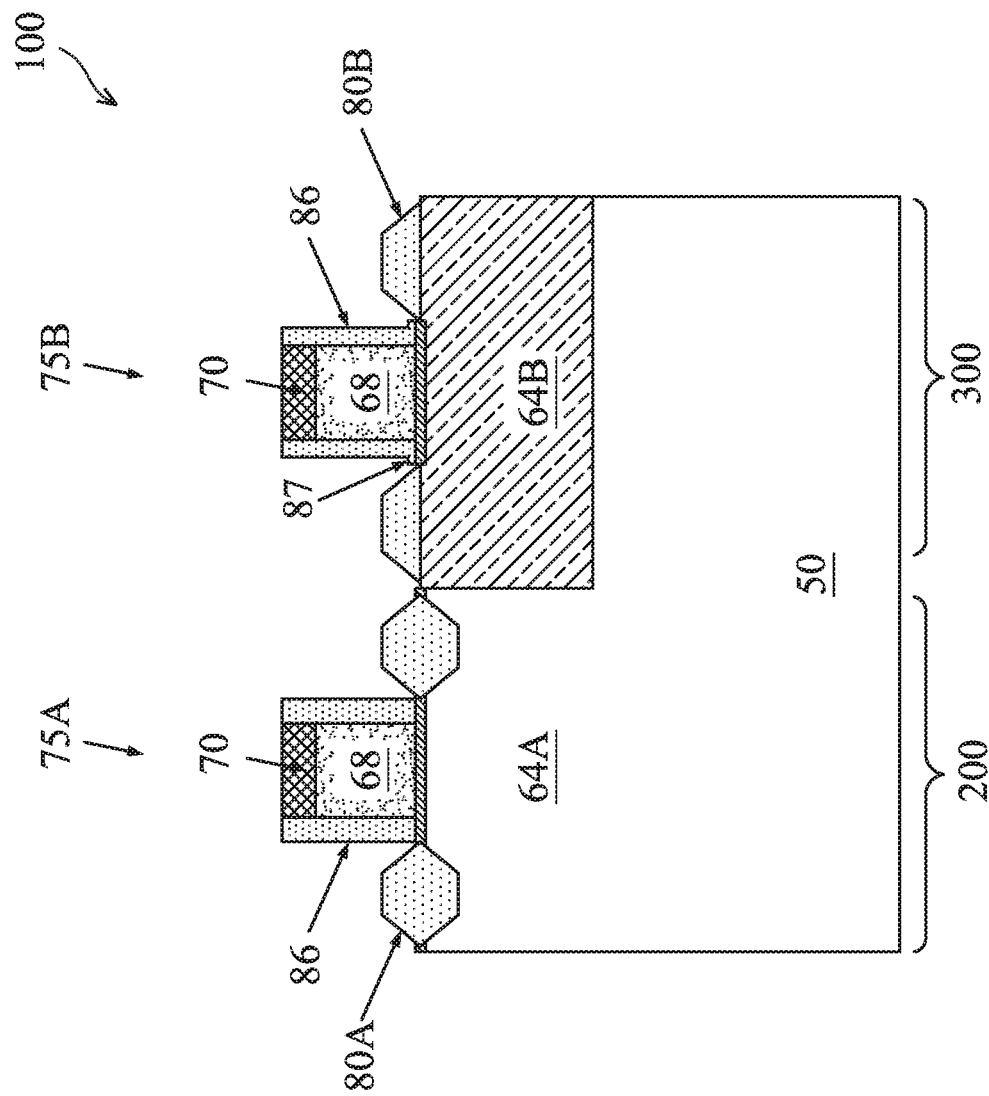
Figure 11C:
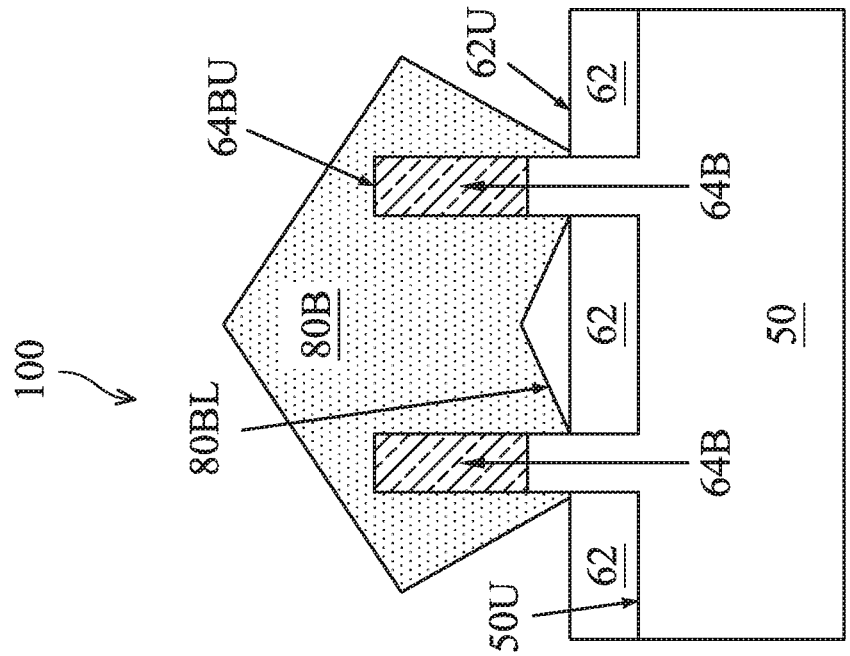
Figure 11B:
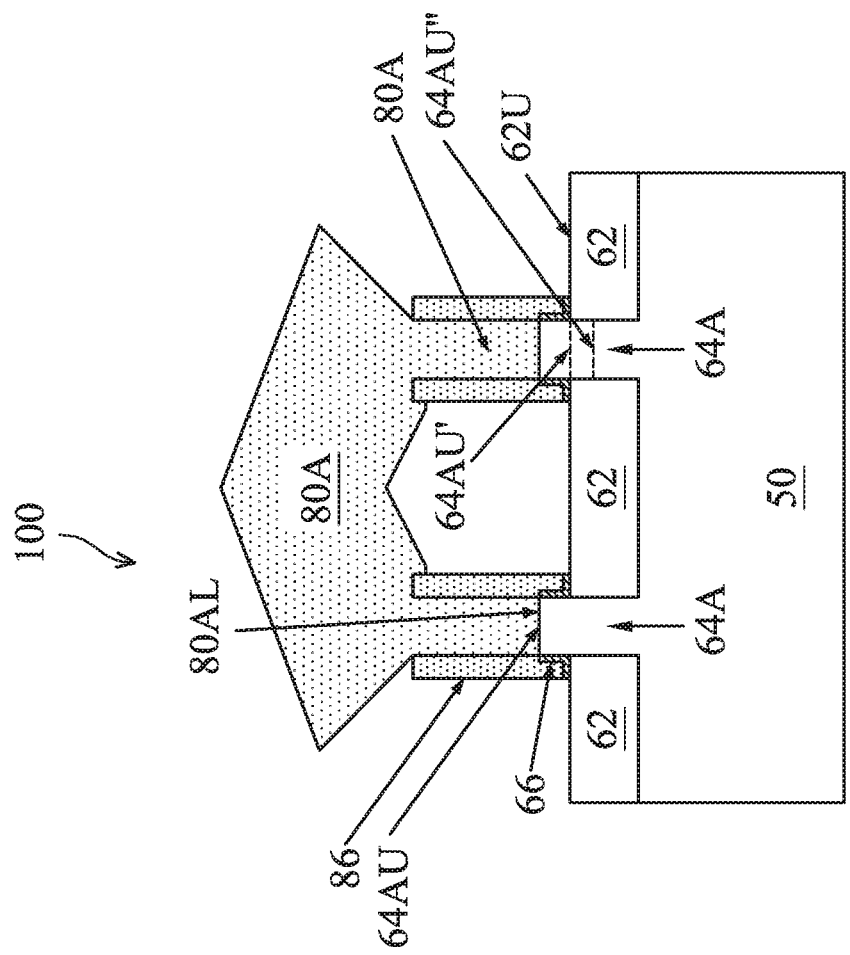

Next, in FIGS. 11A-11C, the second spacer layer 84 in the region 200 and the remaining portion 84R of the second spacer layer 84 in the region 300 are removed using a suitable process, such as an etching process. A suitable etchant, such as phosphoric acid ($H_3PO_4$), may be used for the etching process. Next, the first spacer layer 86 in the region 200 is patterned using, e.g., an isotropic etching process, to remove portions of the first spacer layer 86 over the top surface of the gate structure 75A and over the top surface of the fins 64A. A patterned mask layer (not shown), such as a patterned photo resist, may be used to cover the region 300 while the first spacer layer 86 in the region 200 is patterned. The patterned mask layer is then removed using a suitable method, such as ashing. After the patterning of the first spacer layer 86 as described above, remaining portions of the first spacer layer 86 (see FIG. 11A), such as those along the sidewalls of the gate structures 75A and 75B, will be used as the gate spacers (e.g., low-K gate spacers) of the corresponding gate structure. Therefore, the portions of the first spacer layer 86 along the sidewalls of the gate structures 75A and 75B may be referred to as spacers 86 hereinafter.

Next, although not illustrated, LDD regions may be formed in the fins 64A before the epitaxial source/drain regions 80A are formed. LDD regions may be formed by a plasma doping process. The plasma doping process may implant a corresponding type of impurities, such as N-type impurities (for N-type devices) in the fins 64A to form the LDD regions. For example, a patterned mask layer (not shown) may be formed to shield the region 300 (e.g., a PMOS region) while N-type impurities are implanted into the LDD regions of the fins 64A. The patterned mask layer may be removed after the LDD regions are formed.

Next, epitaxial source/drain regions 80A are formed in the fins 64A. The source/drain regions 80A are formed by etching the fins 64A (e.g., etching the LDD regions within the fins 64A) to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 11A, gaps 87 (e.g., empty space) may be formed between the epitaxial source/drain regions 80B and the spacers 86 of the gate structure 75B, due to the removal of the remaining portions 84R (see FIG. 10A) of the second spacer layer 84. For example, the epitaxial source/drain regions 80B may be spaced apart from the spacers 86 by gaps 87. The width of the gaps 87 may be determined by the width of the remaining portions 84R of the second spacer layer 84. For example, the width of the gaps 87 may be between about 0 nm and 3 nm, although other dimensions are also possible. In contrast, the epitaxial source/drain region 80A physically contacts the spacers 86 of the gate structure 75A, and therefore, there is no gap between the epitaxial source/drain region 80A and the spacers 86 of the gate structure 75A, in some embodiments. In some embodiments, a distance between the epitaxial source/drain regions 80B and the gate structure 75B is larger than a distance between the epitaxial source/drain regions 80A and the gate structure 75A.

As illustrated in FIG. 11B, etching of the LDD regions within the fins 64A recesses a top surface 64AU of the fins 64A. Etching of the LDD region within the fins 64A may also remove portions of the dielectric layer 66 disposed above the top surface 64AU, as illustrated in FIG. 11B, although in other embodiments, etching of the LDD region within the fins 64A does not remove the dielectric layer 66. In the illustrated embodiment of FIG. 11B, the recessed top surface 64AU is above the upper surface 62U of the isolation regions 62. In other embodiments, the recessed top surface of the fins 64A may be below (e.g., see 64AU") or level with (e.g., see 64AU') the upper surface 62U of the isolation regions 62. As illustrated in FIGS. 11B and 11C, a top surface 64BU of the fins 64B extends further away from the upper surface 62U of the isolation regions 62 than the recessed top surface 64AU/64AU'/64AU" of the fins 64A. In some embodiments, the top surface 64BU is higher (e.g., extends further away from the upper surface 62U) than the recessed top surface 64AU/64AU'/64AU" by about 18 nm to about 23 nm.

Referring to FIG. 11B, as a result of the etching of the LDD regions within the fins 64A, a lower portion of the epitaxial source/drain regions 80A grows in the recess between first spacer layer 86 first. Once the recess is filled, upper portions of the epitaxial source/drain regions 80A over the fins 64A are formed, and may merge to form continuous source/drain regions 80A. In some embodiments, a lowermost surface 80AL of the epitaxial source/drain regions 80A contacts the recessed top surface 64AU/64AU'/64AU" of the fin 64A, as illustrated in FIG. 11B. In contrast, a lowermost surface 80BL of the epitaxial source/drain regions 80B may be below the top surface 64BU of the fin 64B, as illustrated in FIG. 11C. In some embodiments, the lowermost surface 80AL of the epitaxial source/drain regions 80A is lower (e.g., closer to the major upper surface 50U of the substrate 50) than the lowermost surface 80BL of the epitaxial source/drain regions 80B.

As illustrated in FIGS. 11A and 11B, the epitaxial source/drain regions 80A may have surfaces raised from respective surfaces of the fins 64A (e.g. raised above the non-recessed portions of the fins 64A) and may have facets. The source/drain regions 80A of the adjacent fins 64A may merge to form a continuous epitaxial source/drain region 80A. In some embodiments, the resulting FinFET in the region 200 is an n-type FinFET, and source/drain regions 80A comprise silicon carbide (SiC), silicon phosphorous (SiP), phosphorous-doped silicon carbon (SiCP), or the like.

The epitaxial source/drain regions 80A may be implanted with dopants followed by an anneal. The source/drain regions 80A may have an impurity (e.g., dopant) concentration in a range from about $1E19$ cm$^{-3}$ to about $1E21$ cm$^{-3}$. In some embodiments, the epitaxial source/drain regions may be in situ doped during growth.

Figure 12A:
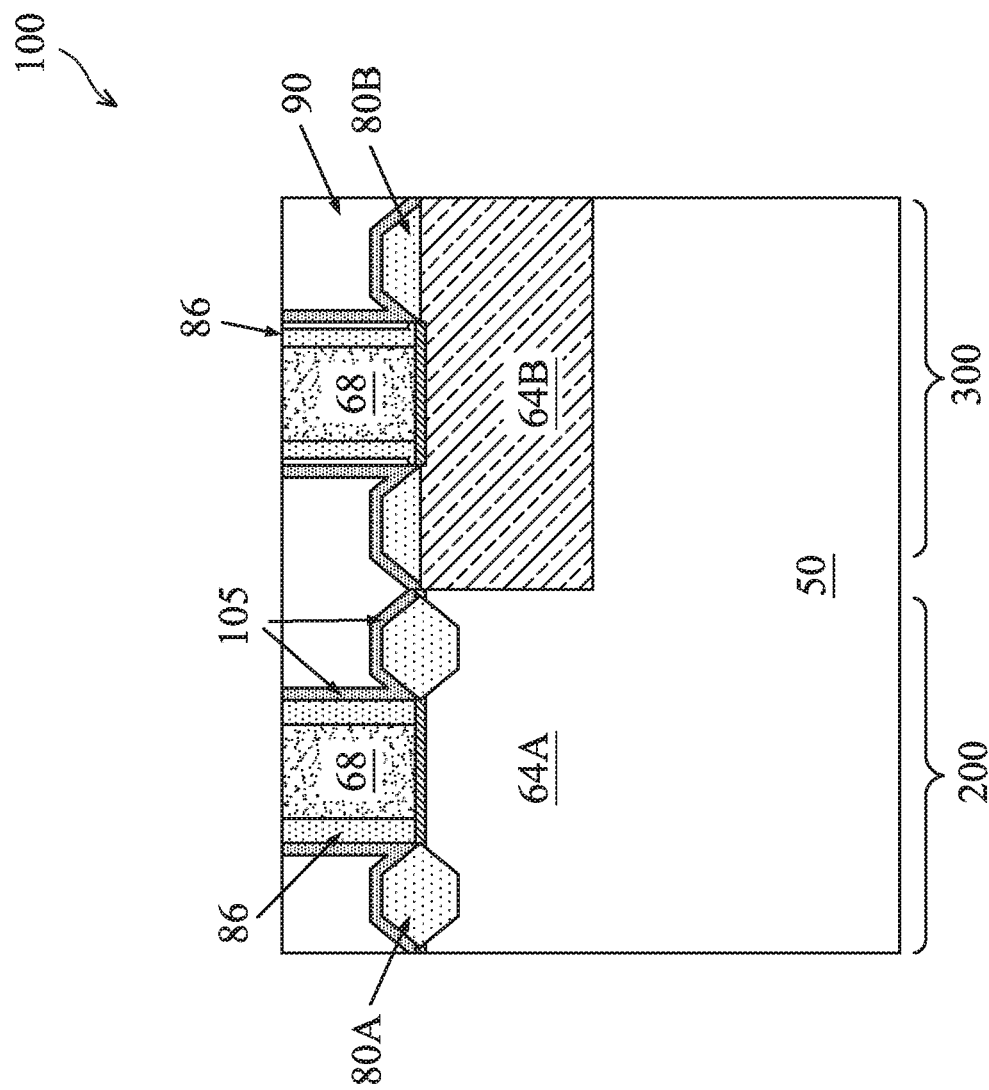

Next, as illustrated in FIGS. 12A-12C, a contact etching stop layer (CESL) 105 is formed (e.g., conformally) over the structured illustrated in FIGS. 11A-11C, and thereafter, a first interlayer dielectric (ILD) 90 is formed over the CESL 105. The CESL may comprise any suitable material such as TiN, and may be formed by a suitable method such as PVD, CVD, or the like. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the first ILD 90 such that the top surface of the first ILD 90 is level with the top surface of the gate 68. The mask 70 (see FIG. 11A), portions of the first spacer layer 86, and portions of the CESL 105 over the upper surface of the gate 68 may be removed by the CMP process. Therefore, after the CMP process, the top surface of the gate 68 is exposed, in some embodiments. In the example of FIGS. 12B and 12C, an air gap exists between the epitaxial source/drain region 80A (or 80B) and the underlying isolation regions 62.

Figure 13:
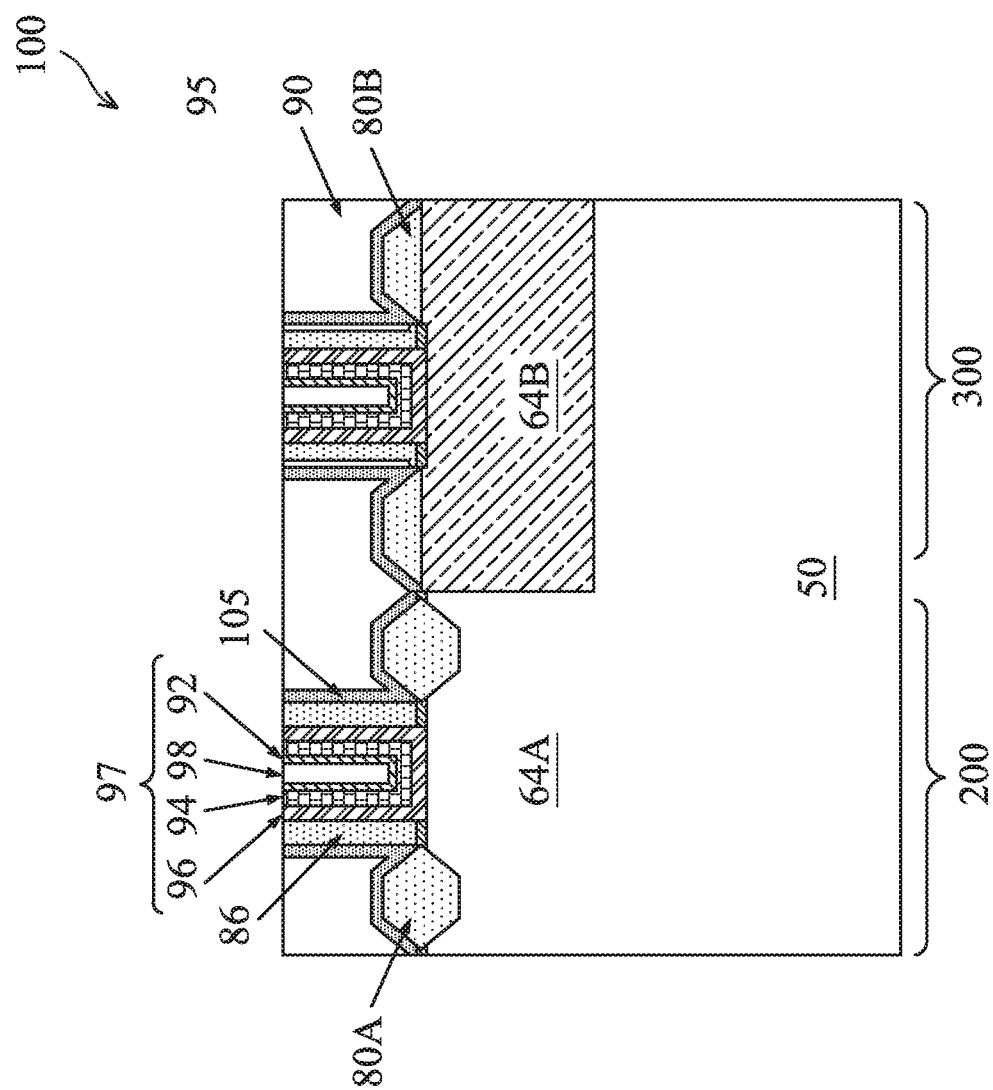

FIGS. 13-16 illustrates the cross-sectional views of the FinFET device 100 in further processing steps along cross-section I-I. As illustrated in FIG. 13, a gate-last process (sometimes referred to as a replacement gate process) is performed. In a gate-last process, the gate 68 and the gate dielectric 66 (see FIG. 12A) are considered dummy structures and are removed and replaced with an active gate (also referred to as a replacement gate) and active gate dielectric. In some embodiment, the active gate is a metal gate.

Referring to FIG. 13, the gate 68 and the gate dielectric 66 directly under the gate 68 are removed in an etching step(s), so that recesses (not shown) are formed between respective spaces 86. The recesses are filled by consecutively forming a gate dielectric layer 96, a barrier layer 94, a seed layer 92, and a gate electrode 98 in the recesses.

In some embodiments, the gate dielectric layer 96 is conformally formed in the recesses. The gate dielectric layer 96 may include silicon dioxide. The silicon oxide may be formed by suitable oxidation and/or deposition methods. In some embodiments, the gate dielectric layer 96 includes a high-k dielectric layer such as hafnium oxide (HfO2). Alternatively, the high-k dielectric layer may include other high-k dielectrics, such as TiO2, HfZrO, Ta2O3, HfSiO4, ZrO2, ZrSiO2, combinations thereof, or other suitable material. The high-k dielectric layer may be formed by ALD, PVD, CVD, or other suitable methods.

Next, a barrier layer 94 is conformally formed over the gate dielectric layer 96. The barrier layer 94 may prevent or reduce the out diffusion of the material of a subsequently formed gate electrode (e.g., 98). The barrier layer 94 may comprise a conductive material such as titanium nitride, although other materials, such as tantalum nitride, titanium, tantalum, or the like may alternatively be utilized. The barrier layer 94 may be formed using a CVD process, such as plasma-enhanced CVD (PECVD). However, other alternative processes, such as sputtering or metal organic chemical vapor deposition (MOCVD), ALD, may alternatively be used.

Next, a seed layer 92 is conformally formed over the barrier layer 94. The seed layer may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer.

Next, a conductive material is formed over the seed layer to fill the recesses to form the gate electrode 98. The conductive material may comprise tungsten, although other suitable materials such as aluminum, copper, rhuthenium, silver, gold, rhodium, molybdenum, nickel, cobalt, cadmium, zinc, alloys of these, combinations thereof, and the like, may alternatively be utilized. The conductive material may be formed by electroplating, PVD, CVD, or any suitable deposition method. A planarization process, such as CMP, may be performed to remove excess portions of the gate dielectric layer 96, the barrier layer 94, the seed layer 92, and the gate electrode 98, which excess portions are disposed, e.g., over the upper surface of the first ILD 90. The remaining portions of the gate dielectric layer 96, the barrier layer 94, the seed layer 92, and the gate electrode 98 in the recesses form the replacement gates 97 of the FinFET device 100.

Figure 14:
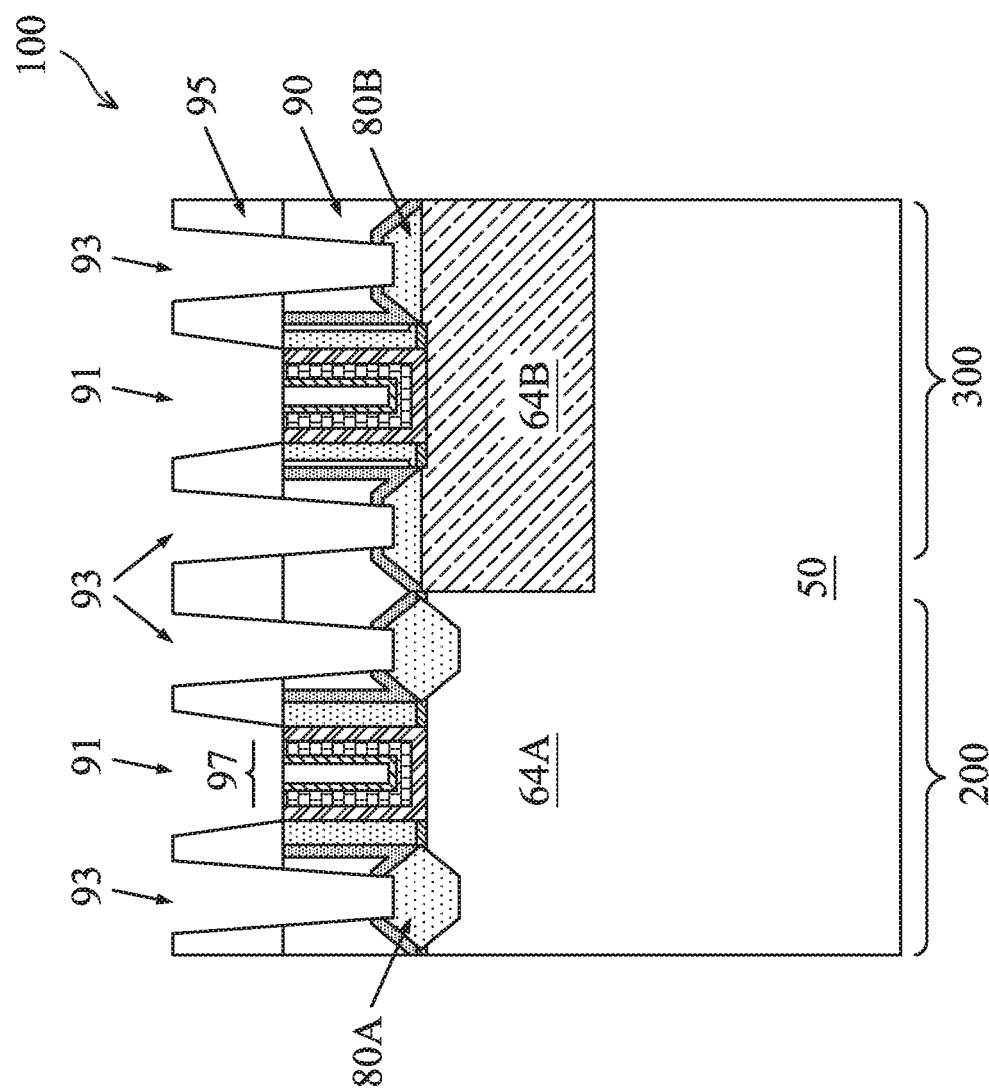

Next, referring to FIG. 14, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contacts plugs 102 (see FIG. 16) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and exposes source/drain regions 80A/80B.

Figure 15:
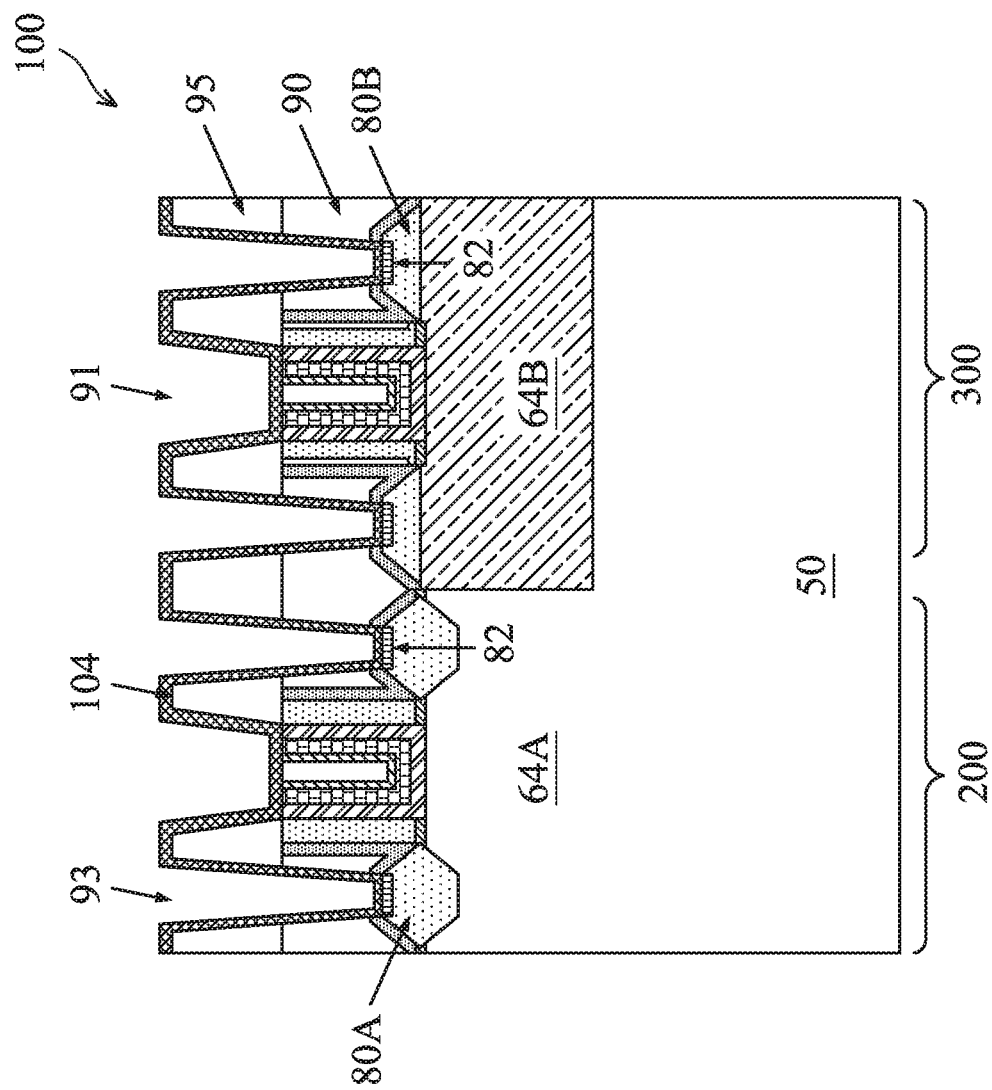

Next, in FIG. 15, silicide regions 82 are formed in the source/drain regions 80A/80B, and a barrier layer 104 is formed over the silicide regions 82 and the second ILD 95. In some embodiments, the silicide regions 82 are formed by depositing, over the source/drain regions 80A/80B, a metal capable of reacting with semiconductor materials (e.g., silicon, germanium) to form silicide or germanide regions. The metal may be nickel, cobalt, titanium, tantalum, platinum, tungsten, other noble metals, other refractory metals, rare earth metals or their alloys. A thermal anneal process is then performed so that the deposited metal reacts with the source/drain regions 80A/80B to form silicide regions 82. After the thermal anneal process, the unreacted metal is removed.

The barrier layer 104 is conformally formed over the silicide regions 82 and the second ILD 95, and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Figure 16:
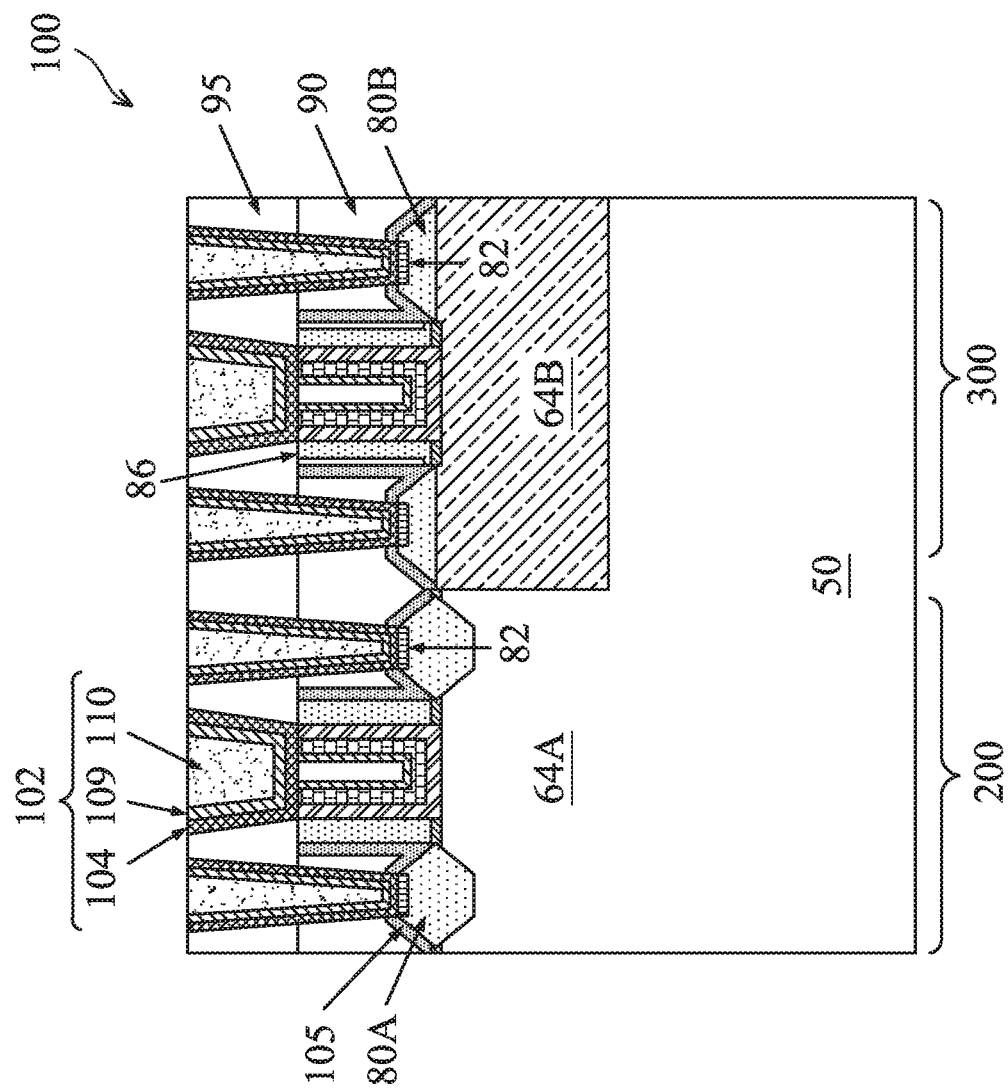

Next, in FIG. 16, a seed layer 109 is formed over the barrier layer 104, and an electrically conductive material 110 is formed over the seed layer 109. The seed layer 109 may be deposited by PVD, ALD or CVD, and may be formed of tungsten, copper, or copper alloys, although other suitable methods and materials may alternatively be used.

Once the seed layer 109 has been formed, the conductive material 110 may be formed onto the seed layer 109 to fill the contact openings 91/93. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings 91/93 have been filled, excess barrier layer 104, seed layer 109, and conductive material 110 outside of the contact openings 91/93 may be removed through a planarization process such as CMP, although any suitable removal process may be used. Contact plugs 102 are thus formed in the contact openings 91/93. Although contact plugs 102 over the source/drain regions 80A/80B and over the replacement gate 97 are illustrated in a same cross-section in FIG. 16, the contact plugs 102 may be in different cross-sections in the FinFET device 100.

Figure 17:
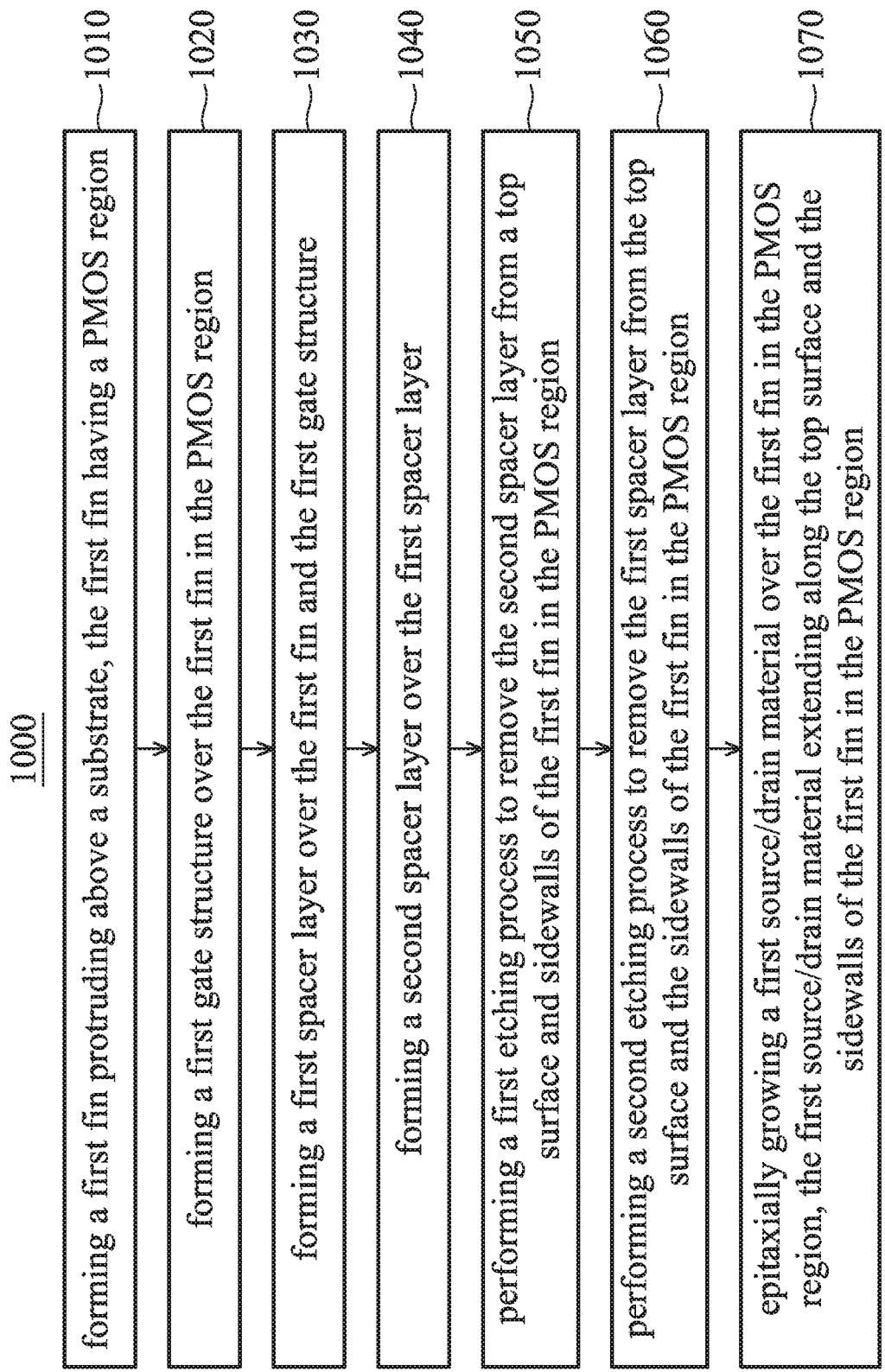
FIG. 17 illustrates a flow chart of a method of forming a semiconductor device.

FIG. 17 illustrates a flow chart of a method of forming a semiconductor device, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged and repeated.

Referring to FIG. 17, at step 1010, a first fin is formed protruding above a substrate, the first fin having a PMOS region and an NMOS region. At step 1020, a first gate structure is formed over the first fin in the PMOS region. At step 1030, a first spacer layer is formed over the first fin and the first gate structure. At step 1040, a second spacer layer is formed over the first spacer layer. At step 1050, a first etching process is performed to remove the second spacer layer from a top surface and sidewalls of the first fin in the PMOS region. At step 1060, a second etching process is performed to remove the first spacer layer from the top surface and the sidewalls of the first fin in the PMOS region. At step 1070, a first source/drain material is epitaxially grown over the first fin in the PMOS region, the first source/drain material extending along the top surface and the sidewalls of the first fin in the PMOS region.

Embodiments may achieve advantages. The disclosed multi-layered spacer structure with the first spacer layer 86 and the second spacer layer structure 84, coupled with the disclosed etching process (e.g., dry etch followed by wet etch), removes the spacer layers (e.g., 84 and 86) from the top surface and sidewalls of the fins 64B while keeping portions of the spacer layers on the sidewalls of the gate structure 75B. The cladding epitaxy structure (e.g., 80B) is formed on the top surface and the sidewalls of the fins 65B with large volume, which results in improves device performance, such as lower drain induced barrier loss (DIBL), larger ON-current $I_{on}$, lower contact resistance, and improved device reliability. In addition, damage to the gate structure 75B and the fins 64B are reduced, which results in better control of the profile of the FinFET device formed. Furthermore, the loading effect between inner portions of the isolation regions 62 and outer portions of the isolation regions 62 is reduced. Another advantage is enhanced strain of the PMOS channel due to the cladding epitaxy structure enabled by the present disclosure.

In an embodiment, a method includes forming a first fin protruding above a substrate, the first fin having a PMOS region; forming a first gate structure over the first fin in the PMOS region; forming a first spacer layer over the first fin and the first gate structure; forming a second spacer layer over the first spacer layer; performing a first etching process to remove the second spacer layer from a top surface and sidewalls of the first fin in the PMOS region; performing a second etching process to remove the first spacer layer from the top surface and the sidewalls of the first fin in the PMOS region; and epitaxially growing a first source/drain material over the first fin in the PMOS region, the first source/drain material extending along the top surface and the sidewalls of the first fin in the PMOS region. In an embodiment, the first spacer layer and the second spacer layer are formed of different materials. In an embodiment, performing the first etching process comprises performing an anisotropic etching process. In an embodiment, after performing the first etching process, the first spacer layer over the top surface and the sidewalls of the first fin in the PMOS region is exposed, and a remaining portion of the second spacer layer extends along sidewalls of the first gate structure, and the first spacer layer is between the remaining portion of the second spacer layer and the first gate structure. In an embodiment, the second etching process exposes the top surface and the sidewalls of the first fin in the PMOS region. In an embodiment, performing the first etching process comprises performing a plasma etch process, where the plasma etch process comprises a first plasma etching step and a second plasma etching step, where the first plasma etching step is performed using tetrafluoromethane ($CF_4$), and the second plasma etching step is performed using oxygen ($O_2$). In an embodiment, performing the second etching process includes performing a chemical etch process, where the chemical etch process includes a first step, a second step, a third step and a fourth step performed sequentially. In an embodiment, the first step is performed using a mixture comprising hydrogen peroxide ($H_2O_2$) and ozone ($O_3$), the second step is performed using diluted hydrofluoric acid (dHF), the third step is performed using phosphoric acid ($H_3PO_4$), and the fourth step is performed using a mixture comprising deionized water (DIW), ammonium hydroxide ($NH_4OH$), and hydrogen peroxide ($H_2O_2$). In an embodiment, the first fin further has an NMOS region, where the method further includes forming a second gate structure over the first fin in the NMOS region, where the first spacer layer and the second spacer layer are formed over the second gate structure; forming a patterned mask layer to cover the NMOS region before performing the first etching process; and removing the patterned mask layer after epitaxially growing the first source/drain material. In an embodiment, the method further includes after epitaxially growing the first source/drain material, removing remaining portions of the second spacer layer in the PMOS region and the NMOS region; and epitaxially growing a second source/drain material over the first fin in the NMOS region. In an embodiment, epitaxially growing the second source/drain material includes removing a portion of the first spacer layer to expose a top surface of the first fin in the NMOS region; recessing the top surface of the first fin in the NMOS region; and epitaxially growing the second source/drain material over the recessed top surface of the first fin in the NMOS region.

In an embodiment, a method includes forming a fin protruding above a substrate, the fin having a PMOS region and an NMOS region; forming a first gate over the fin in the PMOS region; forming a second gate over the fin in the NMOS region; forming a first spacer layer over the fin, the first gate, and the second gate; forming a second spacer layer different from the first spacer layer over the first spacer layer; forming a patterned mask layer to cover the NMOS region while leaving the PMOS region exposed; and after forming the patterned mask layer, performing a first etching process to remove the second spacer layer from a top surface and sidewalls of the fin in the PMOS region; performing a second etching process to remove the first spacer layer from the top surface and the sidewalls of the fin in the PMOS region, thereby exposing the top surface and the sidewalls of the fin in the PMOS region; and epitaxially growing a first semiconductor material along the top surface and the sidewalls of the fin in the PMOS region. In an embodiment, the first spacer layer is formed using a material selected from the group consisting essentially of silicon oxycarbide, silicon oxycarbonitride, and silicon carbonitride, and where the second spacer layer is formed using a material selected from the group consisting essentially of silicon nitride and silicon carbonitride. In an embodiment, the first etching process includes a dry etch process, and the second etching process comprises a wet etch process. In an embodiment, performing the first etching process comprises performing a plasma etch process using carbon monoxide, tetrafluoromethane, oxygen, or ozone. In an embodiment, the method further includes after epitaxially growing the first semiconductor material, removing the patterned mask layer; recessing a top surface of the fin in the NMOS region; and epitaxially growing a second semiconductor material over the recessed top surface of the fin in the NMOS region.

In an embodiment, a semiconductor device includes a fin protruding above a substrate, the fin having a first portion and a second portion, the first portion being in a PMOS region, and the second portion being in an NMOS region; a first gate structure over the first portion of the fin in the PMOS region; a second gate structure over the second portion of the fin in the NMOS region; first epitaxial source/drain regions on opposing sides of the first gate structure and over the first portion of the fin, the first epitaxial source/drain regions being in the PMOS region and extending along a first upper surface and first sidewalls of the first portion of the fin; and second epitaxial source/drain regions on opposing sides of the second gate structure and over the second portion of the fin, the second epitaxial source/drain regions being in the NMOS region and over a second upper surface of the second portion of the fin in the NMOS region. In an embodiment, a lowermost surface of the second epitaxial source/drain regions contacts the second upper surface of the second portion of the fin in the NMOS region. In an embodiment, the semiconductor device further includes first spacers on opposing sidewalls of the second portion of the fin in the NMOS region, and opposing sidewalls of the first portion of the fin in the PMOS region are free of the first spacers. In an embodiment, the first upper surface of the first portion of the fin extends further from the substrate than the second upper surface of the second portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin protruding above a substrate, the fin having a first portion and a second portion, the first portion being in a PMOS region, and the second portion being in an NMOS region;
   a first gate structure over the first portion of the fin in the PMOS region;
   first gate spacers extending along opposing sidewalls of the first gate structure;
   a second gate structure over the second portion of the fin in the NMOS region;
   second gate spacers extending along opposing sidewalls of the second gate structure;
   first epitaxial source/drain regions on opposing sides of the first gate structure and over the first portion of the fin, the first epitaxial source/drain regions being in the PMOS region and extending along a first upper surface of the first portion of the fin and along first sidewalls of the first portion of the fin; and
   second epitaxial source/drain regions on opposing sides of the second gate structure and over the second portion of the fin, the second epitaxial source/drain regions being in the NMOS region and over a second upper surface of the second portion of the fin, wherein a first distance between the first gate spacers and respective first epitaxial source/drain regions is greater than a second distance between the second gate spacers and respective second epitaxial source/drain regions.

2. The semiconductor device of claim 1, wherein a lowermost surface of the second epitaxial source/drain regions contacts the second upper surface of the second portion of the fin.

3. The semiconductor device of claim 1, further comprising first spacers on opposing sidewalls of the second portion of the fin, wherein opposing sidewalls of the first portion of the fin in the PMOS region are free of the first spacers.

4. The semiconductor device of claim 1, wherein the first upper surface of the first portion of the fin extends further from the substrate than the second upper surface of the second portion of the fin.

5. The semiconductor device of claim 1, wherein the first epitaxial source/drain regions are spaced apart from the first gate spacers.

6. The semiconductor device of claim 5, wherein the second epitaxial source/drain regions physically contact respective ones of the second gate spacers.

7. The semiconductor device of claim 1, wherein the first portion of the fin and the second portion of the fin comprise different materials.

8. The semiconductor device of claim 7, wherein the first portion of the fin further includes an upper layer and a lower layer, wherein the upper layer comprises a first semiconductor material different from a second semiconductor material of the lower layer.

9. The semiconductor device of claim 1, further comprising:
   an etch stop layer over the first epitaxial source/drain regions, over the second epitaxial source/drain regions, along sidewalls of the first gate structure, and along sidewalls of second gate structure;
   a dielectric layer over the etch stop layer and around the first gate structure and the second gate structure; and
   contact plugs extending through the dielectric layer and electrically coupled to the first epitaxial source/drain regions and the second epitaxial source/drain regions.

10. A semiconductor device comprising:
    a fin protruding above a substrate, the fin having a first portion and a second portion, the first portion and the second portion disposed along a longitudinal axis of the fin, the first portion and the second portion comprising different semiconductor materials;
    a first gate over the first portion of the fin;
    a second gate over the second portion of the fin;
    first source/drain regions on opposing sides of the first gate and over the first portion of the fin; and second source/drain regions on opposing sides of the second gate and over the second portion of the fin, wherein the first source/drain regions physically contact first sidewalls and a first upper surface of the first portion of the fin, the second source/drain regions physically contact a second upper surface of the second portion of the fin, and second sidewalls of the second portion of the fin are free of the second source/drain regions.

11. The semiconductor device of claim 10, wherein a first composition of the first source/drain regions is different from a second composition of the second source/drain regions.

12. The semiconductor device of claim 10, wherein the first portion of the fin is in a PMOS region of the semiconductor device, and the second portion of the fin is in an NMOS region of the semiconductor device.

13. The semiconductor device of claim 12, wherein the first portion of the fin comprises silicon germanium, and the second portion of the fin comprises silicon carbide.

14. The semiconductor device of claim 10, wherein the first upper surface of the first portion of the fin extends further from the substrate than the second upper surface of the second portion of the fin.

15. A semiconductor device comprising:
a fin extending from a PMOS region of the semiconductor device to an NMOS region of the semiconductor device, wherein a first portion of the fin is in the PMOS region, and a second portion of the fin is in the NMOS region, wherein the first portion and the second portion are in physical contact and form the fin that extends continuously from the PMOS region to the NMOS region;
a first gate structure over the first portion of the fin;
first source/drain regions on opposing sides of the first gate structure and in the PMOS region, wherein the first source/drain regions extend along and contact first sidewalls and a first upper surface of the first portion of the fin;
a second gate structure over the second portion of the fin; and
second source/drain regions on opposing sides of the second gate structure and in the NMOS region, wherein the second source/drain regions contacts a second upper surface of the second portion of the fin, and second sidewalls of the second portion of the fin are free of the second source/drain regions.

16. The semiconductor device of claim 15, further comprising:
first gate spacers along sidewalls of the first gate structure; and
second gate spacers along sidewalls of the second gate structure, wherein the first source/drain regions contact the first gate spacers, and the second source/drain regions are spaced apart from the second gate spacers.

17. The semiconductor device of claim 15, wherein the first upper surface of the first portion of the fin is further from the substrate than the second upper surface of the second portion of the fin.

18. The semiconductor device of claim 15, wherein the first portion of the fin and the second portion of the fin comprise different materials, wherein the first portion of the fin further includes an upper layer and a lower layer, wherein the upper layer comprises a first semiconductor material different from a second semiconductor material of the lower layer.

19. The semiconductor device of claim 15, further comprising:
first gate spacers along sidewalls of the first gate structure; and
second gate spacers along sidewalls of the second gate structure, wherein a first distance between the first gate structure and one of the first source/drain regions is larger than a second distance between the second gate structure and one of the second source/drain regions.

20. The semiconductor device of claim 15, wherein the first portion and the second portion of the fin extend along a longitudinal axis of the fin.

* * * * *